United States Patent
Olson et al.

(10) Patent No.: US 8,458,446 B2
(45) Date of Patent: Jun. 4, 2013

(54) ACCESSING A MULTIBANK REGISTER FILE USING A THREAD IDENTIFIER

(75) Inventors: Christopher H. Olson, Austin, TX (US); Xiang Shan Li, Austin, TX (US); Robert T. Golla, Round Rock, TX (US)

(73) Assignee: Oracle America, Inc., Redwood City, CA (US)

( * ) Notice: Subject to any disclaimer, the term of this patent is extended or adjusted under 35 U.S.C. 154(b) by 786 days.

(21) Appl. No.: 12/570,682

(22) Filed: Sep. 30, 2009

(65) Prior Publication Data

US 2011/0078414 A1    Mar. 31, 2011

(51) Int. Cl.
G06F 9/30    (2006.01)

(52) U.S. Cl.
USPC ......................................................... 712/228

(58) Field of Classification Search
None
See application file for complete search history.

(56) References Cited

U.S. PATENT DOCUMENTS

| | | | |
|---|---|---|---|
| 6,134,653 A | 10/2000 | Roy | |
| 7,600,101 B2 | 10/2009 | Soltis, Jr. | |
| 7,634,621 B1 * | 12/2009 | Coon et al. | 711/149 |
| 7,805,594 B2 * | 9/2010 | Yoshida | 712/228 |
| 2002/0156999 A1 | 10/2002 | Eickemeyer | |
| 2006/0012603 A1 | 1/2006 | Lindholm | |
| 2008/0082893 A1 | 4/2008 | Wang | |

* cited by examiner

*Primary Examiner* — David Huisman
*Assistant Examiner* — Benjamin Geib
(74) *Attorney, Agent, or Firm* — Meyertons, Hood, Kivlin, Kowert & Goetzel, P.C.; Anthony M. Petro

(57) ABSTRACT

A processor includes an instruction fetch unit configured to issue instructions for execution, where the instructions are selected from a number of threads, where each given instruction has a corresponding thread identifier, and where at least some of the instructions specify operand(s) via register identifiers. A register file stores operands usable by the instructions, and may include several banks, each corresponding to a register identifiers and including several entries corresponding to the several threads, wherein the entries are configured to store data values. In response to receiving a request to read a particular register identifier for a given thread identifier, the register file may be configured to decode the given thread identifier to retrieve entries from the banks that correspond to the given thread identifier. The register file may further select, from among the retrieved entries, a data value corresponding to the particular register identifier to be output.

20 Claims, 8 Drawing Sheets

ACCESSING A MULTIBANK REGISTER FILE USING A THREAD IDENTIFIER

BACKGROUND

1. Field of the Invention

This invention relates to processors and, more particularly, to techniques for organizing register files in multithreaded processors.

2. Description of the Related Art

Multithreaded processors may provide certain performance advantages over single-threaded processors. Typically, multithreaded processors may be configured to concurrently fetch, issue, and execute instructions that correspond to distinct threads of code, such as individual processes executing on a computer system. By using multithreaded execution, it may be possible to increase overall computational throughput even when executing workloads that do not exhibit significant intra-thread parallelism. For example, if a processor has two parallel execution paths that can concurrently execute instructions, then under some circumstances, two concurrently executing threads may keep those paths busier than if the processor attempted to exploit the parallelism available in a single one of the threads.

Configuring a processor for multithreaded execution may present various implementation challenges, however. For example, to avoid context-switching overhead, a multithreaded processor may be configured to implement a separate copy of architectural state (e.g., of the programmer-visible register files) for each executing thread. As the number of threads increases, the size of the circuit structures used to store such state also increases. In turn, this may result in increased processor die area, power consumption, design complexity, or other challenges.

SUMMARY

Various embodiments of a register file organized for use with multithreaded processors as well as processors employing register windows are disclosed. In one embodiment, a processor includes an instruction fetch unit that may be configured to issue instructions for execution, where the instructions are selected from a number of threads, where each given instruction has a corresponding thread identifier identifying the given instruction's associated thread, and where at least some of the instructions specify one or more operands via one or more of a number of register identifiers.

The processor may further include a register file configured to store operands usable by the instructions during execution. The register file may include several banks, where each bank corresponds to a respective one of the register identifiers and includes several entries corresponding to the several threads, wherein the entries are configured to store data values.

In response to receiving a request to read a particular register identifier, where the request corresponds to a given thread identifier, the register file may be configured to decode the given thread identifier to retrieve entries from the plurality of banks that correspond to the given thread identifier. The register file may further select, from among the retrieved entries, a data value corresponding to the particular register identifier to be output as a result of said request.

In another embodiment, a processor may include an instruction fetch unit that may be configured to issue instructions for execution, where each given instruction has a corresponding current window pointer identifying one of several register windows associated with the given instruction, and where at least some of the instructions specify one or more operands via one or more of a number of register identifiers.

The processor may further include a register file configured to store operands usable by the instructions during execution. The register file may include several banks, where each bank corresponds to a respective one of the register identifiers and includes several entries corresponding to the several register windows, wherein the entries are configured to store data values.

In response to receiving a request to read a particular register identifier, where the request corresponds to a given current window pointer, the register file may be configured to decode the given current window pointer to retrieve entries from the plurality of banks that correspond to the given current window pointer. The register file may further select, from among the retrieved entries, a data value corresponding to the particular register identifier to be output as a result of said request.

Figure 1:
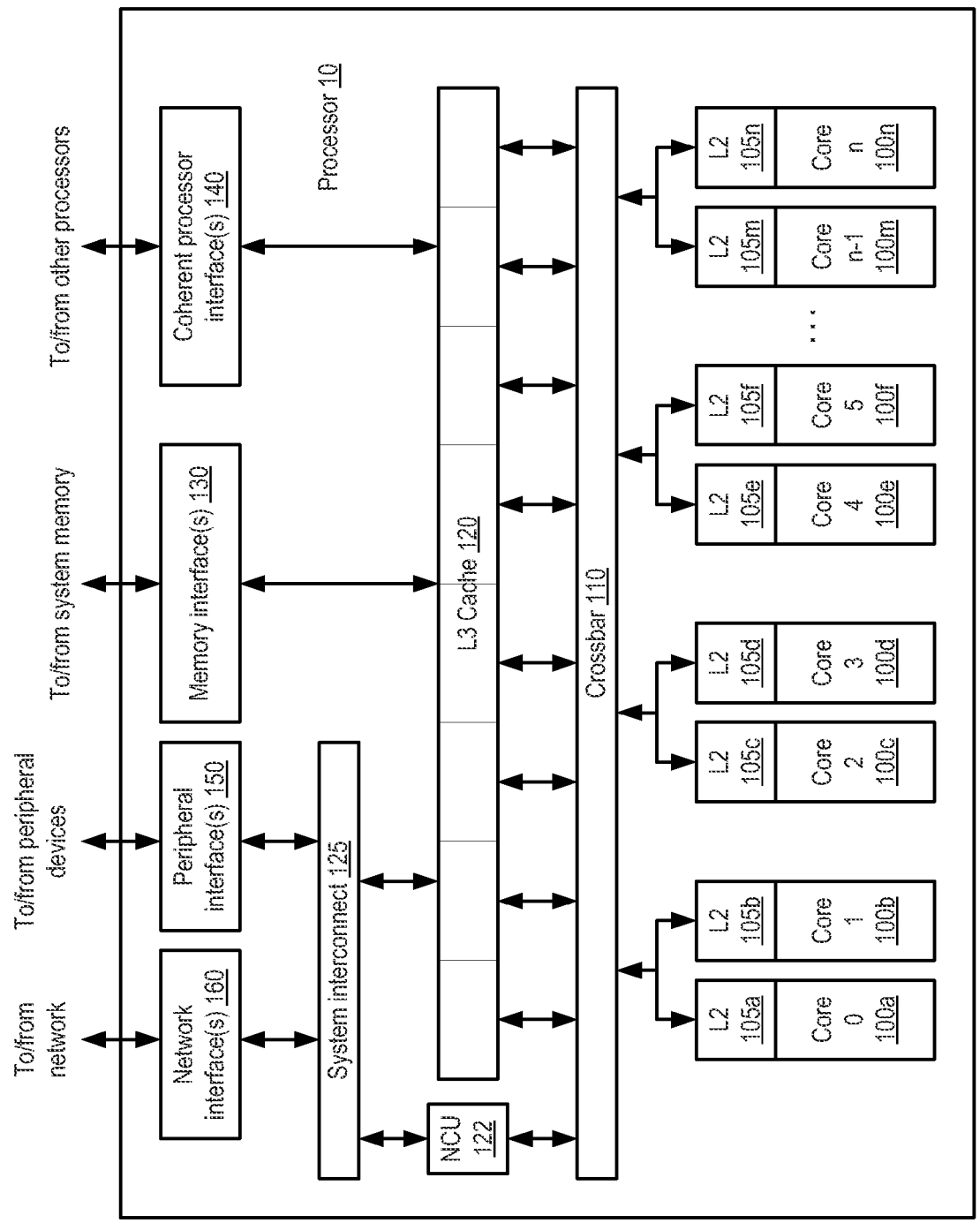
FIG. 1 is a block diagram illustrating an embodiment of a multithreaded processor.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the present disclosure as defined by the appended claims.

DETAILED DESCRIPTION OF EMBODIMENTS

Introduction

In the following discussion, techniques for organizing register files in multithreaded processors are explored. First, an overview is provided of one type of multithreaded processor in which such register files may be provided. Next, general register file considerations in multithreaded processors are discussed. Particular embodiments of multithreaded/multiwindowed register files that may require fewer total read and write ports than conventional register files are then described.

Finally, an example system embodiment including a processor that may implement embodiments of these register files is discussed.

Overview of Multithreaded Processor Architecture

A block diagram illustrating one embodiment of a multithreaded processor 10 is shown in FIG. 1. In the illustrated embodiment, processor 10 includes a number of processor cores 100*a-n*, which are also designated "core 0" though "core n." Various embodiments of processor 10 may include varying numbers of cores 100, such as 8, 16, or any other suitable number. Each of cores 100 is coupled to a corresponding L2 cache 105*a-n*, which in turn couple to L3 cache 120 via a crossbar 110. Cores 100*a-n* and L2 caches 105*a-n* may be generically referred to, either collectively or individually, as core(s) 100 and L2 cache(s) 105, respectively.

Via crossbar 110 and L3 cache 120, cores 100 may be coupled to a variety of devices that may be located externally to processor 10. In the illustrated embodiment, one or more memory interface(s) 130 may be configured to couple to one or more banks of system memory (not shown). One or more coherent processor interface(s) 140 may be configured to couple processor 10 to other processors (e.g., in a multiprocessor environment employing multiple units of processor 10). Additionally, system interconnect 125 couples cores 100 to one or more peripheral interface(s) 150 and network interface(s) 160. As described in greater detail below, these interfaces may be configured to couple processor 10 to various peripheral devices and networks.

Cores 100 may be configured to execute instructions and to process data according to a particular instruction set architecture (ISA). In one embodiment, cores 100 may be configured to implement a version of the SPARC® ISA, such as SPARC® V9, UltraSPARC Architecture 2005, UltraSPARC Architecture 2007, or UltraSPARC Architecture 2009, for example. However, in other embodiments it is contemplated that any desired ISA may be employed, such as x86 (32-bit or 64-bit versions), PowerPC® or MIPS®, for example.

In the illustrated embodiment, each of cores 100 may be configured to operate independently of the others, such that all cores 100 may execute in parallel. Additionally, as described below in conjunction with the description of FIG. 2, in some embodiments, each of cores 100 may be configured to execute multiple threads concurrently, where a given thread may include a set of instructions that may execute independently of instructions from another thread. (For example, an individual software process, such as an application, may consist of one or more threads that may be scheduled for execution by an operating system.) Such a core 100 may also be referred to as a multithreaded (MT) core. In one embodiment, each of cores 100 may be configured to concurrently execute instructions from a variable number of threads, up to eight concurrently-executing threads. In a 16-core implementation, processor 10 could thus concurrently execute up to 128 threads. However, in other embodiments it is contemplated that other numbers of cores 100 may be provided, and that cores 100 may concurrently process different numbers of threads.

Additionally, as described in greater detail below, in some embodiments, each of cores 100 may be configured to execute certain instructions out of program order, which may also be referred to herein as out-of-order execution, or simply OOO. As an example of out-of-order execution, for a particular thread, there may be instructions that are subsequent in program order to a given instruction yet do not depend on the given instruction. If execution of the given instruction is delayed for some reason (e.g., owing to a cache miss), the later instructions may execute before the given instruction completes, which may improve overall performance of the executing thread.

As shown in FIG. 1, in one embodiment, each core 100 may have a dedicated corresponding L2 cache 105. In one embodiment, L2 cache 105 may be configured as a set-associative, writeback cache that is fully inclusive of first-level cache state (e.g., instruction and data caches within core 100). To maintain coherence with first-level caches, embodiments of L2 cache 105 may implement a reverse directory that maintains a virtual copy of the first-level cache tags. L2 cache 105 may implement a coherence protocol (e.g., the MESI protocol) to maintain coherence with other caches within processor 10. In one embodiment, L2 cache 105 may enforce a Total Store Ordering (TSO) model of execution in which all store instructions from the same thread must complete in program order.

In various embodiments, L2 cache 105 may include a variety of structures configured to support cache functionality and performance. For example, L2 cache 105 may include a miss buffer configured to store requests that miss the L2, a fill buffer configured to temporarily store data returning from L3 cache 120, a writeback buffer configured to temporarily store dirty evicted data and snoop copyback data, and/or a snoop buffer configured to store snoop requests received from L3 cache 120. In one embodiment, L2 cache 105 may implement a history-based prefetcher that may attempt to analyze L2 miss behavior and correspondingly generate prefetch requests to L3 cache 120.

Crossbar 110 may be configured to manage data flow between L2 caches 105 and the shared L3 cache 120. In one embodiment, crossbar 110 may include logic (such as multiplexers or a switch fabric, for example) that allows any L2 cache 105 to access any bank of L3 cache 120, and that conversely allows data to be returned from any L3 bank to any L2 cache 105. That is, crossbar 110 may be configured as an M-to-N crossbar that allows for generalized point-to-point communication. However, in other embodiments, other interconnection schemes may be employed between L2 caches 105 and L3 cache 120. For example, a mesh, ring, or other suitable topology may be utilized.

Crossbar 110 may be configured to concurrently process data requests from L2 caches 105 to L3 cache 120 as well as data responses from L3 cache 120 to L2 caches 105. In some embodiments, crossbar 110 may include logic to queue data requests and/or responses, such that requests and responses may not block other activity while waiting for service. Additionally, in one embodiment crossbar 110 may be configured to arbitrate conflicts that may occur when multiple L2 caches 105 attempt to access a single bank of L3 cache 120, or vice versa.

L3 cache 120 may be configured to cache instructions and data for use by cores 100. In the illustrated embodiment, L3 cache 120 may be organized into eight separately addressable banks that may each be independently accessed, such that in the absence of conflicts, each bank may concurrently return data to a respective L2 cache 105. In some embodiments, each individual bank may be implemented using set-associative or direct-mapped techniques. For example, in one embodiment, L3 cache 120 may be an 8 megabyte (MB) cache, where each 1 MB bank is 16-way set associative with a 64-byte line size. L3 cache 120 may be implemented in some embodiments as a writeback cache in which written (dirty) data may not be written to system memory until a corresponding cache line is evicted. However, it is contemplated that in other embodiments, L3 cache 120 may be configured in any suitable fashion. For example, L3 cache 120 may be implemented with more or fewer banks, or in a scheme that does not employ independently-accessible banks; it may employ other bank sizes or cache geometries (e.g., different line sizes or degrees of set associativity); it may employ write-through instead of writeback behavior; and it may or may not allocate on a write miss. Other variations of L3 cache 120 configuration are possible and contemplated.

In some embodiments, L3 cache 120 may implement queues for requests arriving from and results to be sent to crossbar 110. Additionally, in some embodiments L3 cache 120 may implement a fill buffer configured to store fill data arriving from memory interface 130, a writeback buffer configured to store dirty evicted data to be written to memory, and/or a miss buffer configured to store L3 cache accesses that cannot be processed as simple cache hits (e.g., L3 cache misses, cache accesses matching older misses, accesses such as atomic operations that may require multiple cache accesses, etc.). L3 cache 120 may variously be implemented as single-ported or multiported (i.e., capable of processing multiple concurrent read and/or write accesses). In either case, L3 cache 120 may implement arbitration logic to prioritize cache access among various cache read and write requestors.

Not all external accesses from cores 100 necessarily proceed through L3 cache 120. In the illustrated embodiment, non-cacheable unit (NCU) 122 may be configured to process requests from cores 100 for non-cacheable data, such as data from I/O devices as described below with respect to peripheral interface(s) 150 and network interface(s) 160.

Memory interface 130 may be configured to manage the transfer of data between L3 cache 120 and system memory, for example in response to cache fill requests and data evictions. In some embodiments, multiple instances of memory interface 130 may be implemented, with each instance configured to control a respective bank of system memory. Memory interface 130 may be configured to interface to any suitable type of system memory, such as Fully Buffered Dual Inline Memory Module (FB-DIMM), Double Data Rate or Double Data Rate 2, 3, or 4 Synchronous Dynamic Random Access Memory (DDR/DDR2/DDR3/DDR4 SDRAM), or Rambus® DRAM (RDRAM®), for example. In some embodiments, memory interface 130 may be configured to support interfacing to multiple different types of system memory.

In the illustrated embodiment, processor 10 may also be configured to receive data from sources other than system memory. System interconnect 125 may be configured to provide a central interface for such sources to exchange data with cores 100, L2 caches 105, and/or L3 cache 120. In some embodiments, system interconnect 125 may be configured to coordinate Direct Memory Access (DMA) transfers of data to and from system memory. For example, via memory interface 130, system interconnect 125 may coordinate DMA transfers between system memory and a network device attached via network interface 160, or between system memory and a peripheral device attached via peripheral interface 150.

Processor 10 may be configured for use in a multiprocessor environment with other instances of processor 10 or other compatible processors. In the illustrated embodiment, coherent processor interface(s) 140 may be configured to implement high-bandwidth, direct chip-to-chip communication between different processors in a manner that preserves memory coherence among the various processors (e.g., according to a coherence protocol that governs memory transactions).

Peripheral interface 150 may be configured to coordinate data transfer between processor 10 and one or more peripheral devices. Such peripheral devices may include, for example and without limitation, storage devices (e.g., magnetic or optical media-based storage devices including hard drives, tape drives, CD drives, DVD drives, etc.), display devices (e.g., graphics subsystems), multimedia devices (e.g., audio processing subsystems), or any other suitable type of peripheral device. In one embodiment, peripheral interface 150 may implement one or more instances of a standard peripheral interface. For example, one embodiment of peripheral interface 150 may implement the Peripheral Component Interface Express (PCI Express™ or PCIe) standard according to generation 1.x, 2.0, 3.0, or another suitable variant of that standard, with any suitable number of I/O lanes. However, it is contemplated that any suitable interface standard or combination of standards may be employed. For example, in some embodiments peripheral interface 150 may be configured to implement a version of Universal Serial Bus (USB) protocol or IEEE 1394 (Firewire®) protocol in addition to or instead of PCI Express™.

Network interface 160 may be configured to coordinate data transfer between processor 10 and one or more network devices (e.g., networked computer systems or peripherals) coupled to processor 10 via a network. In one embodiment, network interface 160 may be configured to perform the data processing necessary to implement an Ethernet (IEEE 802.3) networking standard such as Gigabit Ethernet or 10-Gigabit Ethernet, for example. However, it is contemplated that any suitable networking standard may be implemented, including forthcoming standards such as 40-Gigabit Ethernet and 100-Gigabit Ethernet. In some embodiments, network interface 160 may be configured to implement other types of networking protocols, such as Fibre Channel, Fibre Channel over Ethernet (FCoE), Data Center Ethernet, Infiniband, and/or other suitable networking protocols. In some embodiments, network interface 160 may be configured to implement multiple discrete network interface ports.

Overview of Dynamic Multithreading Processor Core

As mentioned above, in one embodiment each of cores 100 may be configured for multithreaded, out-of-order execution. More specifically, in one embodiment, each of cores 100 may be configured to perform dynamic multithreading. Generally speaking, under dynamic multithreading, the execution resources of cores 100 may be configured to efficiently process varying types of computational workloads that exhibit different performance characteristics and resource requirements. Such workloads may vary across a continuum that emphasizes different combinations of individual-thread and multiple-thread performance.

At one end of the continuum, a computational workload may include a number of independent tasks, where completing the aggregate set of tasks within certain performance criteria (e.g., an overall number of tasks per second) is a more significant factor in system performance than the rate at which any particular task is completed. For example, in certain types of server or transaction processing environments, there may be a high volume of individual client or customer requests (such as web page requests or file system accesses). In this context, individual requests may not be particularly sensitive to processor performance. For example, requests may be I/O-bound rather than processor-bound—completion of an individual request may require I/O accesses (e.g., to relatively slow memory, network, or storage devices) that dominate the overall time required to complete the request, relative to the processor effort involved. Thus, a processor that is capable of concurrently processing many such tasks (e.g., as independently executing threads) may exhibit better performance on such a workload than a processor that emphasizes the performance of only one or a small number of concurrent tasks.

At the other end of the continuum, a computational workload may include individual tasks whose performance is highly processor-sensitive. For example, a task that involves significant mathematical analysis and/or transformation (e.g., cryptography, graphics processing, scientific computing) may be more processor-bound than I/O-bound. Such tasks may benefit from processors that emphasize single-task performance, for example through speculative execution and exploitation of instruction-level parallelism.

Dynamic multithreading represents an attempt to allocate processor resources in a manner that flexibly adapts to workloads that vary along the continuum described above. In one embodiment, cores 100 may be configured to implement fine-grained multithreading, in which each core may select instructions to execute from among a pool of instructions corresponding to multiple threads, such that instructions from different threads may be scheduled to execute adjacently. For example, in a pipelined embodiment of core 100 employing fine-grained multithreading, instructions from different threads may occupy adjacent pipeline stages, such that instructions from several threads may be in various stages of execution during a given core processing cycle. Through the use of fine-grained multithreading, cores 100 may be configured to efficiently process workloads that depend more on concurrent thread processing than individual thread performance.

In one embodiment, cores 100 may also be configured to implement out-of-order processing, speculative execution, register renaming and/or other features that improve the performance of processor-dependent workloads. Moreover, cores 100 may be configured to dynamically allocate a variety of hardware resources among the threads that are actively executing at a given time, such that if fewer threads are executing, each individual thread may be able to take advantage of a greater share of the available hardware resources. This may result in increased individual thread performance when fewer threads are executing, while retaining the flexibility to support workloads that exhibit a greater number of threads that are less processor-dependent in their performance. In various embodiments, the resources of a given core 100 that may be dynamically allocated among a varying number of threads may include branch resources (e.g., branch predictor structures), load/store resources (e.g., load/store buffers and queues), instruction completion resources (e.g., reorder buffer structures and commit logic), instruction issue resources (e.g., instruction selection and scheduling structures), register rename resources (e.g., register mapping tables), and/or memory management unit resources (e.g., translation lookaside buffers, page walk resources).

Figure 2:
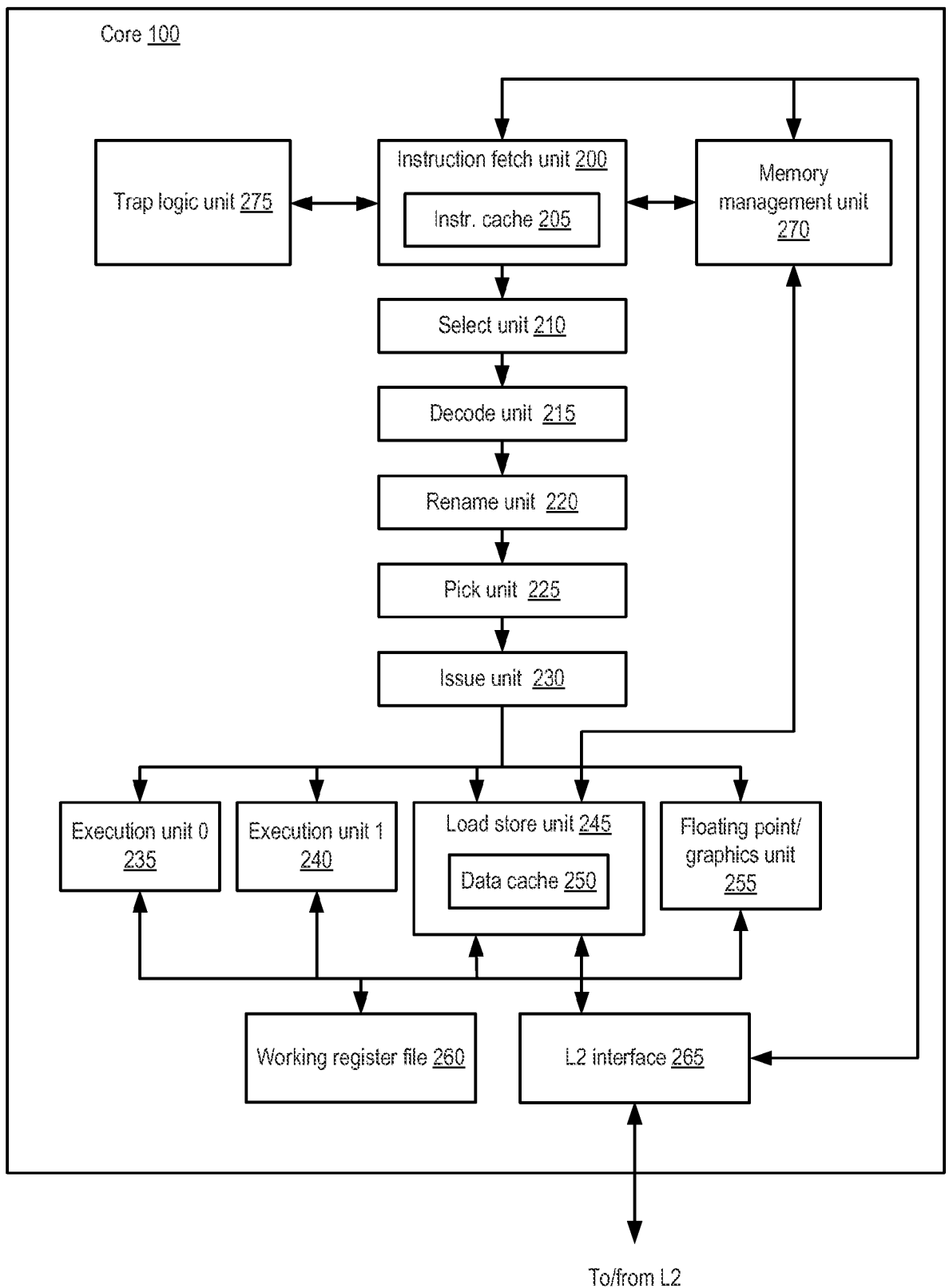
FIG. 2 is a block diagram illustrating an embodiment of a processor core configured to perform fine-grained multithreading.

One embodiment of core 100 that is configured to perform dynamic multithreading is illustrated in FIG. 2. In the illustrated embodiment, core 100 includes an instruction fetch unit (IFU) 200 that includes an instruction cache 205. IFU 200 is coupled to a memory management unit (MMU) 270, L2 interface 265, and trap logic unit (TLU) 275. IFU 200 is additionally coupled to an instruction processing pipeline that begins with a select unit 210 and proceeds in turn through a decode unit 215, a rename unit 220, a pick unit 225, and an issue unit 230. Issue unit 230 is coupled to issue instructions to any of a number of instruction execution resources: an execution unit 0 (EXU0) 235, an execution unit 1 (EXU1) 240, a load store unit (LSU) 245 that includes a data cache 250, and/or a floating point/graphics unit (FGU) 255. These instruction execution resources are coupled to a working register file 260. Additionally, LSU 245 is coupled to L2 interface 265 and MMU 270.

In the following discussion, exemplary embodiments of each of the structures of the illustrated embodiment of core 100 are described. However, it is noted that the illustrated partitioning of resources is merely one example of how core 100 may be implemented. Alternative configurations and variations are possible and contemplated.

Instruction fetch unit 200 may be configured to provide instructions to the rest of core 100 for execution. In one embodiment, IFU 200 may be configured to select a thread to be fetched, fetch instructions from instruction cache 205 for the selected thread and buffer them for downstream processing, request data from L2 cache 105 in response to instruction cache misses, and predict the direction and target of control transfer instructions (e.g., branches). In some embodiments, IFU 200 may include a number of data structures in addition to instruction cache 205, such as an instruction translation lookaside buffer (ITLB), instruction buffers, and/or structures configured to store state that is relevant to thread selection and processing.

In one embodiment, during each execution cycle of core 100, IFU 200 may be configured to select one thread that will enter the IFU processing pipeline. Thread selection may take into account a variety of factors and conditions, some thread-specific and others IFU-specific. For example, certain instruction cache activities (e.g., cache fill), ITLB activities, or diagnostic activities may inhibit thread selection if these activities are occurring during a given execution cycle. Additionally, individual threads may be in specific states of readiness that affect their eligibility for selection. For example, a thread for which there is an outstanding instruction cache miss may not be eligible for selection until the miss is resolved. In some embodiments, those threads that are eligible to participate in thread selection may be divided into groups by priority, for example depending on the state of the thread or of the ability of the IFU pipeline to process the thread. In such embodiments, multiple levels of arbitration may be employed to perform thread selection: selection occurs first by group priority, and then within the selected group according to a suitable arbitration algorithm (e.g., a least-recently-fetched algorithm). However, it is noted that any suitable scheme for thread selection may be employed, including arbitration schemes that are more complex or simpler than those mentioned here.

Once a thread has been selected for fetching by IFU 200, instructions may actually be fetched for the selected thread. To perform the fetch, in one embodiment, IFU 200 may be configured to generate a fetch address to be supplied to instruction cache 205. In various embodiments, the fetch address may be generated as a function of a program counter associated with the selected thread, a predicted branch target address, or an address supplied in some other manner (e.g., through a test or diagnostic mode). The generated fetch address may then be applied to instruction cache 205 to determine whether there is a cache hit.

In some embodiments, accessing instruction cache 205 may include performing fetch address translation (e.g., in the case of a physically indexed and/or tagged cache), accessing a cache tag array, and comparing a retrieved cache tag to a requested tag to determine cache hit status. If there is a cache hit, IFU 200 may store the retrieved instructions within buffers for use by later stages of the instruction pipeline. If there is a cache miss, IFU 200 may coordinate retrieval of the missing cache data from L2 cache 105. In some embodiments, IFU 200 may also be configured to prefetch instructions into instruction cache 205 before the instructions are actually required to be fetched. For example, in the case of a cache miss, IFU 200 may be configured to retrieve the missing data for the requested fetch address as well as addresses that sequentially follow the requested fetch address, on the assumption that the following addresses are likely to be fetched in the near future.

In many ISAs, instruction execution proceeds sequentially according to instruction addresses (e.g., as reflected by one or more program counters). However, control transfer instructions (CTIs) such as branches, call/return instructions, or other types of instructions may cause the transfer of execution from a current fetch address to a nonsequential address. As mentioned above, IFU 200 may be configured to predict the direction and target of CTIs (or, in some embodiments, a subset of the CTIs that are defined for an ISA) in order to reduce the delays incurred by waiting until the effect of a CTI is known with certainty. In one embodiment, IFU 200 may be configured to implement a perception-based dynamic branch predictor, although any suitable type of branch predictor may be employed.

To implement branch prediction, IFU 200 may implement a variety of control and data structures in various embodiments, such as history registers that track prior branch history, weight tables that reflect relative weights or strengths of predictions, and/or target data structures that store fetch addresses that are predicted to be targets of a CTI. Also, in some embodiments, IFU 200 may further be configured to partially decode (or predecode) fetched instructions in order to facilitate branch prediction. A predicted fetch address for a given thread may be used as the fetch address when the given thread is selected for fetching by IFU 200. The outcome of the prediction may be validated when the CTI is actually executed (e.g., if the CTI is a conditional instruction, or if the CTI itself is in the path of another predicted CTI). If the prediction was incorrect, instructions along the predicted path that were fetched and issued may be cancelled.

Through the operations discussed above, IFU 200 may be configured to fetch and maintain a buffered pool of instructions from one or multiple threads, to be fed into the remainder of the instruction pipeline for execution. Generally speaking, select unit 210 may be configured to select and schedule threads for execution. In one embodiment, during any given execution cycle of core 100, select unit 210 may be configured to select up to one ready thread out of the maximum number of threads concurrently supported by core 100 (e.g., 8 threads), and may select up to two instructions from the selected thread for decoding by decode unit 215, although in other embodiments, a differing number of threads and instructions may be selected. In various embodiments, different conditions may affect whether a thread is ready for selection by select unit 210, such as branch mispredictions, unavailable instructions, or other conditions. To ensure fairness in thread selection, some embodiments of select unit 210 may employ arbitration among ready threads (e.g. a least-recently-used algorithm).

The particular instructions that are selected for decode by select unit 210 may be subject to the decode restrictions of decode unit 215; thus, in any given cycle, fewer than the maximum possible number of instructions may be selected. Additionally, in some embodiments, select unit 210 may be configured to allocate certain execution resources of core 100 to the selected instructions, so that the allocated resources will not be used for the benefit of another instruction until they are released. For example, select unit 210 may allocate resource tags for entries of a reorder buffer, load/store buffers, or other downstream resources that may be utilized during instruction execution.

Generally, decode unit 215 may be configured to prepare the instructions selected by select unit 210 for further processing. Decode unit 215 may be configured to identify the particular nature of an instruction (e.g., as specified by its opcode) and to determine the source and sink (i.e., destination) registers encoded in an instruction, if any. In some embodiments, decode unit 215 may be configured to detect certain dependencies among instructions, to remap architectural registers to a flat register space, and/or to convert certain complex instructions to two or more simpler instructions for execution. Additionally, in some embodiments, decode unit 215 may be configured to assign instructions to slots for subsequent scheduling. In one embodiment, two slots 0-1 may be defined, where slot 0 includes instructions executable in load/store unit 245 or execution units 235-240, and where slot 1 includes instructions executable in execution units 235-240, floating point/graphics unit 255, and any branch instructions. However, in other embodiments, other numbers of slots and types of slot assignments may be employed, or slots may be omitted entirely.

Register renaming may facilitate the elimination of certain dependencies between instructions (e.g., write-after-read or "false" dependencies), which may in turn prevent unnecessary serialization of instruction execution. In one embodiment, rename unit 220 may be configured to rename the logical (i.e., architected) destination registers specified by instructions by mapping them to a physical register space, resolving false dependencies in the process. In some embodiments, rename unit 220 may maintain mapping tables that reflect the relationship between logical registers and the physical registers to which they are mapped.

Once decoded and renamed, instructions may be ready to be scheduled for execution. In the illustrated embodiment, pick unit 225 may be configured to pick instructions that are ready for execution and send the picked instructions to issue unit 230. In one embodiment, pick unit 225 may be configured to maintain a pick queue that stores a number of decoded and renamed instructions as well as information about the relative age and status of the stored instructions. During each execution cycle, this embodiment of pick unit 225 may pick up to one instruction per slot. For example, taking instruction dependency and age information into account, for a given slot, pick unit 225 may be configured to pick the oldest instruction for the given slot that is ready to execute.

In some embodiments, pick unit 225 may be configured to support load/store speculation by retaining speculative load/store instructions (and, in some instances, their dependent instructions) after they have been picked. This may facilitate replaying of instructions in the event of load/store misspeculation. Additionally, in some embodiments, pick unit 225 may be configured to deliberately insert "holes" into the pipeline through the use of stalls, e.g., in order to manage downstream pipeline hazards such as synchronization of certain load/store or long-latency FGU instructions.

Issue unit 230 may be configured to provide instruction sources and data to the various execution units for picked instructions. In one embodiment, issue unit 230 may be configured to read source operands from the appropriate source, which may vary depending upon the state of the pipeline. For example, if a source operand depends on a prior instruction that is still in the execution pipeline, the operand may be bypassed directly from the appropriate execution unit result bus. Results may also be sourced from register files representing architectural (i.e., user-visible) as well as non-architectural state. In the illustrated embodiment, core 100 includes a working register file 260 that may be configured to store instruction results (e.g., integer results, floating point results, and/or condition code results) that have not yet been committed to architectural state, and which may serve as the source for certain operands. The various execution units may also maintain architectural integer, floating-point, and condition code state from which operands may be sourced.

Instructions issued from issue unit 230 may proceed to one or more of the illustrated execution units for execution. In one embodiment, each of EXU0 235 and EXU1 240 may be similarly or identically configured to execute certain integer-type instructions defined in the implemented ISA, such as arithmetic, logical, and shift instructions. In the illustrated embodiment, EXU0 235 may be configured to execute integer instructions issued from slot 0, and may also perform address calculation for load/store instructions executed by LSU 245. EXU1 240 may be configured to execute integer instructions issued from slot 1, as well as branch instructions. In one embodiment, FGU instructions and multicycle integer instructions may be processed as slot 1 instructions that pass through the EXU1 240 pipeline, although some of these instructions may actually execute in other functional units.

In some embodiments, architectural and non-architectural register files may be physically implemented within or near execution units 235-240. It is contemplated that in some embodiments, core 100 may include more or fewer than two integer execution units, and the execution units may or may not be symmetric in functionality. Also, in some embodiments execution units 235-240 may not be bound to specific issue slots, or may be differently bound than just described.

Load store unit 245 may be configured to process data memory references, such as integer and floating-point load and store instructions and other types of memory reference instructions. LSU 245 may include a data cache 250 as well as logic configured to detect data cache misses and to responsively request data from L2 cache 105. In one embodiment, data cache 250 may be configured as a set-associative, write-through cache in which all stores are written to L2 cache 105 regardless of whether they hit in data cache 250. As noted above, the actual computation of addresses for load/store instructions may take place within one of the integer execution units, though in other embodiments, LSU 245 may implement dedicated address generation logic. In some embodiments, LSU 245 may implement an adaptive, history-dependent hardware prefetcher configured to predict and prefetch data that is likely to be used in the future, in order to increase the likelihood that such data will be resident in data cache 250 when it is needed.

In various embodiments, LSU 245 may implement a variety of structures configured to facilitate memory operations. For example, LSU 245 may implement a data TLB to cache virtual data address translations, as well as load and store buffers configured to store issued but not-yet-committed load and store instructions for the purposes of coherency snooping and dependency checking LSU 245 may include a miss buffer configured to store outstanding loads and stores that cannot yet complete, for example due to cache misses. In one embodiment, LSU 245 may implement a store queue configured to store address and data information for stores that have committed, in order to facilitate load dependency checking LSU 245 may also include hardware configured to support atomic load-store instructions, memory-related exception detection, and read and write access to special-purpose registers (e.g., control registers).

Floating point/graphics unit 255 may be configured to execute and provide results for certain floating-point and graphics-oriented instructions defined in the implemented ISA. For example, in one embodiment FGU 255 may implement single- and double-precision floating-point arithmetic instructions compliant with the IEEE 754-1985 floating-point standard, such as add, subtract, multiply, divide, and certain transcendental functions. Also, in one embodiment FGU 255 may implement partitioned-arithmetic and graphics-oriented instructions defined by a version of the SPARC® Visual Instruction Set (VIS™) architecture, such as VIS™ 2.0 or VIS™ 3.0. In some embodiments, FGU 255 may implement fused and unfused floating-point multiply-add instructions. Additionally, in one embodiment FGU 255 may implement certain integer instructions such as integer multiply, divide, and population count instructions. Depending on the implementation of FGU 255, some instructions (e.g., some transcendental or extended-precision instructions) or instruction operand or result scenarios (e.g., certain denormal operands or expected results) may be trapped and handled or emulated by software.

In one embodiment, FGU 255 may implement separate execution pipelines for floating point add/multiply, divide/square root, and graphics operations, while in other embodiments the instructions implemented by FGU 255 may be differently partitioned. In various embodiments, instructions implemented by FGU 255 may be fully pipelined (i.e., FGU 255 may be capable of starting one new instruction per execution cycle), partially pipelined, or may block issue until complete, depending on the instruction type. For example, in one embodiment floating-point add and multiply operations may be fully pipelined, while floating-point divide operations may block other divide/square root operations until completed.

Embodiments of FGU 255 may also be configured to implement hardware cryptographic support. For example, FGU 255 may include logic configured to support encryption/decryption algorithms such as Advanced Encryption Standard (AES), Data Encryption Standard/Triple Data Encryption Standard (DES/3DES), the Kasumi block cipher algorithm, and/or the Camellia block cipher algorithm. FGU 255 may also include logic to implement hash or checksum algorithms such as Secure Hash Algorithm (SHA-1, SHA-256, SHA-384, SHA-512), or Message Digest 5 (MD5). FGU 255 may also be configured to implement modular arithmetic such as modular multiplication, reduction and exponentiation, as well as various types of Galois field operations. In one embodiment, FGU 255 may be configured to utilize the floating-point multiplier array for modular multiplication. In various embodiments, FGU 255 may implement several of the aforementioned algorithms as well as other algorithms not specifically described.

The various cryptographic and modular arithmetic operations provided by FGU 255 may be invoked in different ways for different embodiments. In one embodiment, these features may be implemented via a discrete coprocessor that may be indirectly programmed by software, for example by using a control word queue defined through the use of special registers or memory-mapped registers. In another embodiment, the ISA may be augmented with specific instructions that may allow software to directly perform these operations.

As previously described, instruction and data memory accesses may involve translating virtual addresses to physical addresses. In one embodiment, such translation may occur on a page level of granularity, where a certain number of address bits comprise an offset into a given page of addresses, and the remaining address bits comprise a page number. For example, in an embodiment employing 4 MB pages, a 64-bit virtual address and a 40-bit physical address, 22 address bits (corresponding to 4 MB of address space, and typically the least significant address bits) may constitute the page offset. The remaining 42 bits of the virtual address may correspond to the virtual page number of that address, and the remaining 18 bits of the physical address may correspond to the physical page number of that address. In such an embodiment, virtual to physical address translation may occur by mapping a virtual page number to a particular physical page number, leaving the page offset unmodified.

Such translation mappings may be stored in an ITLB or a DTLB for rapid translation of virtual addresses during lookup of instruction cache 205 or data cache 250. In the event no translation for a given virtual page number is found in the appropriate TLB, memory management unit 270 may be configured to provide a translation. In one embodiment, MMU 270 may be configured to manage one or more translation tables stored in system memory and to traverse such tables (which in some embodiments may be hierarchically organized) in response to a request for an address translation, such as from an ITLB or DTLB miss. (Such a traversal may also be referred to as a page table walk or a hardware table walk.) In some embodiments, if MMU 270 is unable to derive a valid address translation, for example if one of the memory pages including a necessary page table is not resident in physical memory (i.e., a page miss), MMU 270 may be configured to generate a trap to allow a memory management software routine to handle the translation. It is contemplated that in various embodiments, any desirable page size may be employed. Further, in some embodiments multiple page sizes may be concurrently supported.

As noted above, several functional units in the illustrated embodiment of core 100 may be configured to generate off-core memory requests. For example, IFU 200 and LSU 245 each may generate access requests to L2 cache 105 in response to their respective cache misses. Additionally, MMU 270 may be configured to generate memory requests, for example while executing a page table walk. In the illustrated embodiment, L2 interface 265 may be configured to provide a centralized interface to the L2 cache 105 associated with a particular core 100, on behalf of the various functional units that may generate L2 accesses. In one embodiment, L2 interface 265 may be configured to maintain queues of pending L2 requests and to arbitrate among pending requests to determine which request or requests may be conveyed to L2 cache 105 during a given execution cycle. For example, L2 interface 265 may implement a least-recently-used or other algorithm to arbitrate among L2 requestors. In one embodiment, L2 interface 265 may also be configured to receive data returned from L2 cache 105, and to direct such data to the appropriate functional unit (e.g., to data cache 250 for a data cache fill due to miss).

During the course of operation of some embodiments of core 100, exceptional events may occur. For example, an instruction from a given thread that is selected for execution by select unit 210 may be not be a valid instruction for the ISA implemented by core 100 (e.g., the instruction may have an illegal opcode), a floating-point instruction may produce a result that requires further processing in software, MMU 270 may not be able to complete a page table walk due to a page miss, a hardware error (such as uncorrectable data corruption in a cache or register file) may be detected, or any of numerous other possible architecturally-defined or implementation-specific exceptional events may occur. In one embodiment, trap logic unit 275 may be configured to manage the handling of such events. For example, TLU 275 may be configured to receive notification of an exceptional event occurring during execution of a particular thread, and to cause execution control of that thread to vector to a supervisor-mode software handler (i.e., a trap handler) corresponding to the detected event. Such handlers may include, for example, an illegal opcode trap handler configured to return an error status indication to an application associated with the trapping thread and possibly terminate the application, a floating-point trap handler configured to fix up an inexact result, etc.

In one embodiment, TLU 275 may be configured to flush all instructions from the trapping thread from any stage of processing within core 100, without disrupting the execution of other, non-trapping threads. In some embodiments, when a specific instruction from a given thread causes a trap (as opposed to a trap-causing condition independent of instruction execution, such as a hardware interrupt request), TLU 275 may implement such traps as precise traps. That is, TLU 275 may ensure that all instructions from the given thread that occur before the trapping instruction (in program order) complete and update architectural state, while no instructions from the given thread that occur after the trapping instruction (in program) order complete or update architectural state.

Additionally, in the absence of exceptions or trap requests, TLU 275 may be configured to initiate and monitor the commitment of working results to architectural state. For example, TLU 275 may include a reorder buffer (ROB) that coordinates transfer of speculative results into architectural state. TLU 275 may also be configured to coordinate thread flushing that results from branch misprediction. For instructions that are not flushed or otherwise cancelled due to mispredictions or exceptions, instruction processing may end when instruction results have been committed.

In various embodiments, any of the units illustrated in FIG. 2 may be implemented as one or more pipeline stages, to form an instruction execution pipeline that begins when thread fetching occurs in IFU 200 and ends with result commitment by TLU 275. Depending on the manner in which the functionality of the various units of FIG. 2 is partitioned and implemented, different units may require different numbers of cycles to complete their portion of instruction processing. In some instances, certain units (e.g., FGU 255) may require a variable number of cycles to complete certain types of operations.

Through the use of dynamic multithreading, in some instances, it is possible for each stage of the instruction pipeline of core 100 to hold an instruction from a different thread in a different stage of execution, in contrast to conventional processor implementations that typically require a pipeline flush when switching between threads or processes. In some embodiments, flushes and stalls due to resource conflicts or other scheduling hazards may cause some pipeline stages to have no instruction during a given cycle. However, in the fine-grained multithreaded processor implementation employed by the illustrated embodiment of core 100, such flushes and stalls may be directed to a single thread in the pipeline, leaving other threads undisturbed. Additionally, even if one thread being processed by core 100 stalls for a significant length of time (for example, due to an L2 cache miss), instructions from another thread may be readily selected for issue, thus increasing overall thread processing throughput.

As described previously, however, the various resources of core 100 that support fine-grained multithreaded execution may also be dynamically reallocated to improve the performance of workloads having fewer numbers of threads. Under these circumstances, some threads may be allocated a larger share of execution resources while other threads are allocated correspondingly fewer resources. Even when fewer threads are sharing comparatively larger shares of execution resources, however, core 100 may still exhibit the flexible, thread-specific flush and stall behavior described above.

Register File Considerations in Multithreaded Processors

As mentioned above, in various embodiments, core 100 may include various register files that may be configured to store architectural or non-architectural state. Depending on the ISA implemented by processor 10, core 100 may include separate register files configured to store the integer and floating-point architectural state that is visible to a programmer of processor 10, as well as a non-architectural working register file (e.g., working register file 260) that may be configured to store speculative machine state after it has been generated but before the speculative state has been committed to architectural state. The parameters of architectural state, such as the number and size of registers and their logical organization, may typically be governed by the ISA. For example, the SPARC ISA defines a flat register file structure for floating-point architectural state that includes 32 programmer-visible 64-bit floating-point registers, and employs a more complicated structure (discussed in greater detail below) for integer registers. In contrast to architectural state, the parameters of non-architectural state may be implementation-specific.

Figure 3:
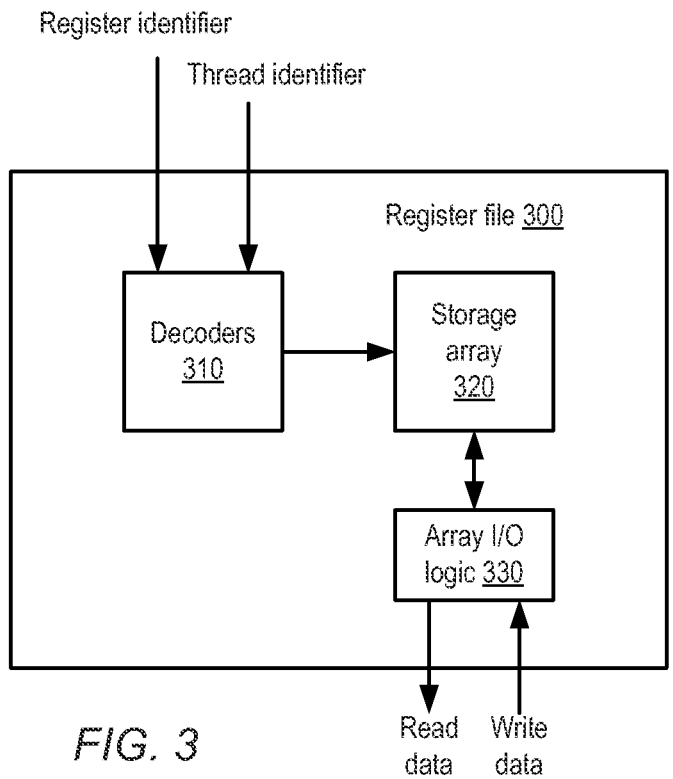
FIG. 3 is a block diagram illustrating a possible arrangement of a register file.

FIG. 3 illustrates one possible arrangement of the structural features that may appear in various embodiments of a register file. In the illustrated embodiment, register file 300 includes decoders 310 coupled to a storage array 320, which in turn is coupled to array input/output (I/O) logic 330. In some embodiments, decoders 310 may be configured to decode the inputs to register file 300 that specify a particular register or registers that are to be selected, and to convert those inputs into a format usable to select the identified register from within storage array 320. For example, as shown in FIG. 3, register file 300 may be configured to receive a register identifier and a thread identifier. In an embodiment where register file 300 implements 32 distinct registers for each of 8 threads, the register and thread identifiers may be received as respective 5-bit and 3-bit values, though any suitable encoding may be employed. Decoders 310 may be configured to convert these inputs into a one-hot format, such as a word line and/or bank select signal configured to select a particular entry or bank of storage array 320, or into any other format suitable for use by storage array 320.

Storage array 320 may be configured to provide a number of readable and writable storage locations that store register file data. In some embodiments, storage array 320 may be implemented as a static RAM (SRAM) array. For example, storage array 320 may include a number of multiported SRAM bit cells arranged in rows and columns, such that when a particular register is selected and appropriately decoded by decoders 310, the particular SRAM bit cells corresponding to that register are selected for reading or writing, as appropriate. It is noted that in various embodiments, storage array 320 need not employ SRAM cells, and may instead be implemented using any suitable technique.

In various embodiments, array I/O logic 330 may be configured to format external data received by register file 300 for storage within storage array 320, and/or to format data read out of storage array 320 before it is output from register file 300. For example, in embodiments where storage array 320 expects dual-rail write data or some other type of data encoding, array I/O logic 330 may be configured to convert write data from the format in which it is received by register file 300 (e.g., single-ended format) to the required encoding. Similarly, in embodiments where sense amplifiers, multiplexers, or other types of output processing are needed to process the output of storage array 320 before it may be output from register file 300, array I/O logic 330 may be configured to perform the needed processing of read data.

Register files are often built as multiported structures having multiple read and/or write ports, so that multiple registers may be concurrently read or written during a single cycle of operation. Enabling concurrent access to different registers through different ports may considerably speed the operation of core 100 relative to embodiments in which there are insufficient register file ports to meet the demand for data. In the latter case, data producers and consumers (such as execution units 235-240, load/store unit 245, and FGU 255) might be forced to spend idle cycles waiting for a register file port to become available for reading or writing.

Both ISA-imposed requirements and implementation choices may influence the number of ports chosen for a register file. For example, the ISA may define the maximum number of register-sourced operands a single instruction may consume, while the core implementation may define the maximum number of instructions that may concurrently execute. Thus, for instance, if for a given ISA an instruction may require at most two register operands, and a given core implementation seeks to execute at most three instructions concurrently, then to fully support the worst-case data bandwidth required by this configuration, register file 300 may be configured with six output/read ports (two for each of three concurrent instructions) and three input/write ports (one for each of three concurrent instructions).

Figure 4:
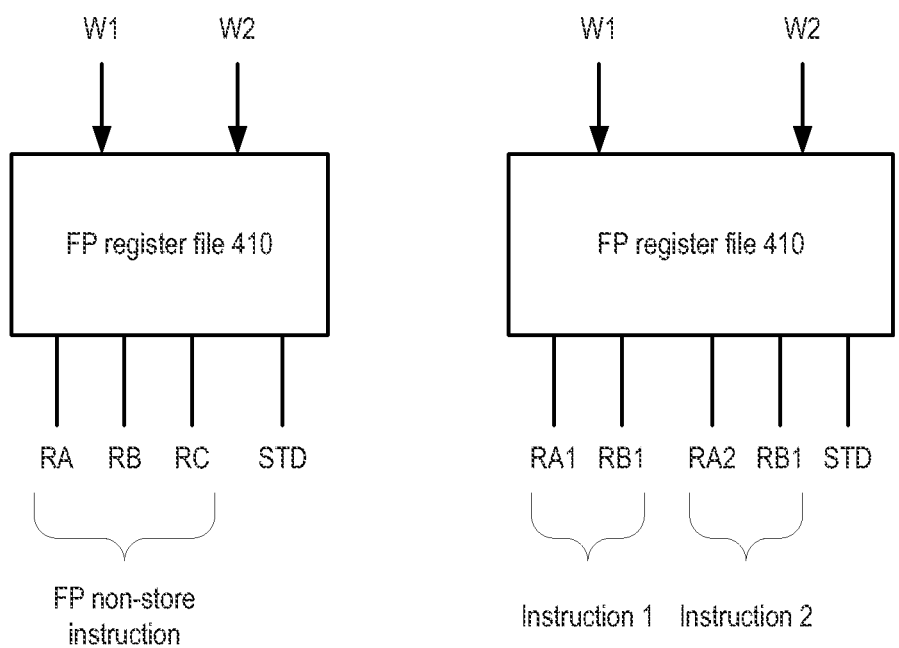
FIG. 4 is a block diagram illustrating different port configurations of different embodiments of a register file.

Numerous types of register file port configurations are possible, and different datapaths within the same core 100 may have different register file port configurations. Two example port configurations are shown in FIG. 4 as register files 410-420. In the illustrated embodiment, FP register file 410 may be configured to implement floating point (FP) registers. In this particular embodiment, non-store FP instructions may have at most 3 register operands, while FP store instructions may need access to only one FP register operand to obtain the store data. (Operands needed for store address generation may be source from integer registers, for example.) Thus, to support concurrent execution of one FP instruction having up to three register operands and one FP store instruction having one register operand, FP register file 410 may be configured with 6 total ports: 4 register file output ports (3 to provide operands for a non-store FP instruction, and 1 to provide store data for an FP store instruction) and 2 register file input ports to write the results of up to 2 FP instructions. In FIG. 4, the output ports are respectively denoted RA, RB, RC, and STD, and the input ports are denoted W1 and W2.

In the illustrated embodiment, integer register file 420 has a different port configuration than FP register file 410. In this embodiment, integer instructions other than store instructions may have at most 2 register operands, while an integer store instruction may need access to only one integer register operand to obtain the store data. Thus, to support concurrent execution of two ordinary integer instructions and one integer store data instruction, integer register file 420 may be configured with 7 total ports: 5 register file output ports (2 to provide operands for each of the ordinary integer instructions and 1 to provide store data for an integer store data instruction) and 2 register file input ports (1 to write the result of each integer instruction). In the illustrated embodiment, integer load instructions may be treated for port assignment purposes like any other non-store integer instruction. In FIG. 4, the output ports are respectively denoted RA1, RB1, RA2, RB2, and STD, and the input ports are denoted W1 and W2.

It is noted that the illustrated embodiments of FP register file 410 and integer register file 420 represent only one possible configuration. Numerous other configurations reflecting different levels of concurrent instruction support as well as instructions having different operand requirements are possible and contemplated.

The data bandwidth of a register file may increase as the number of read/write ports is increased. For example, a register file having 2 output ports and 2 input ports may provide double the data bandwidth of a register file having only 1 output and 1 input port (assuming the same port width in both instances). However, multiported register files typically require multiported storage cells within storage array 320, which may increase the overall size and thus the design cost of the register file.

Figure 5A:
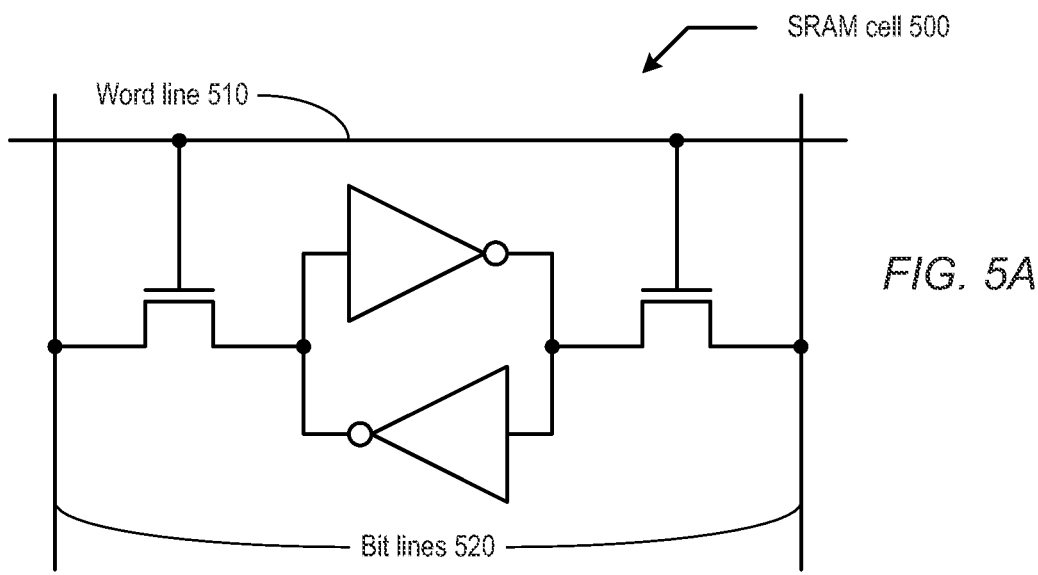
FIGS. 5A-B are circuit diagrams illustrating embodiments of single-ported and multiported SRAM cells.
Figure 5B:
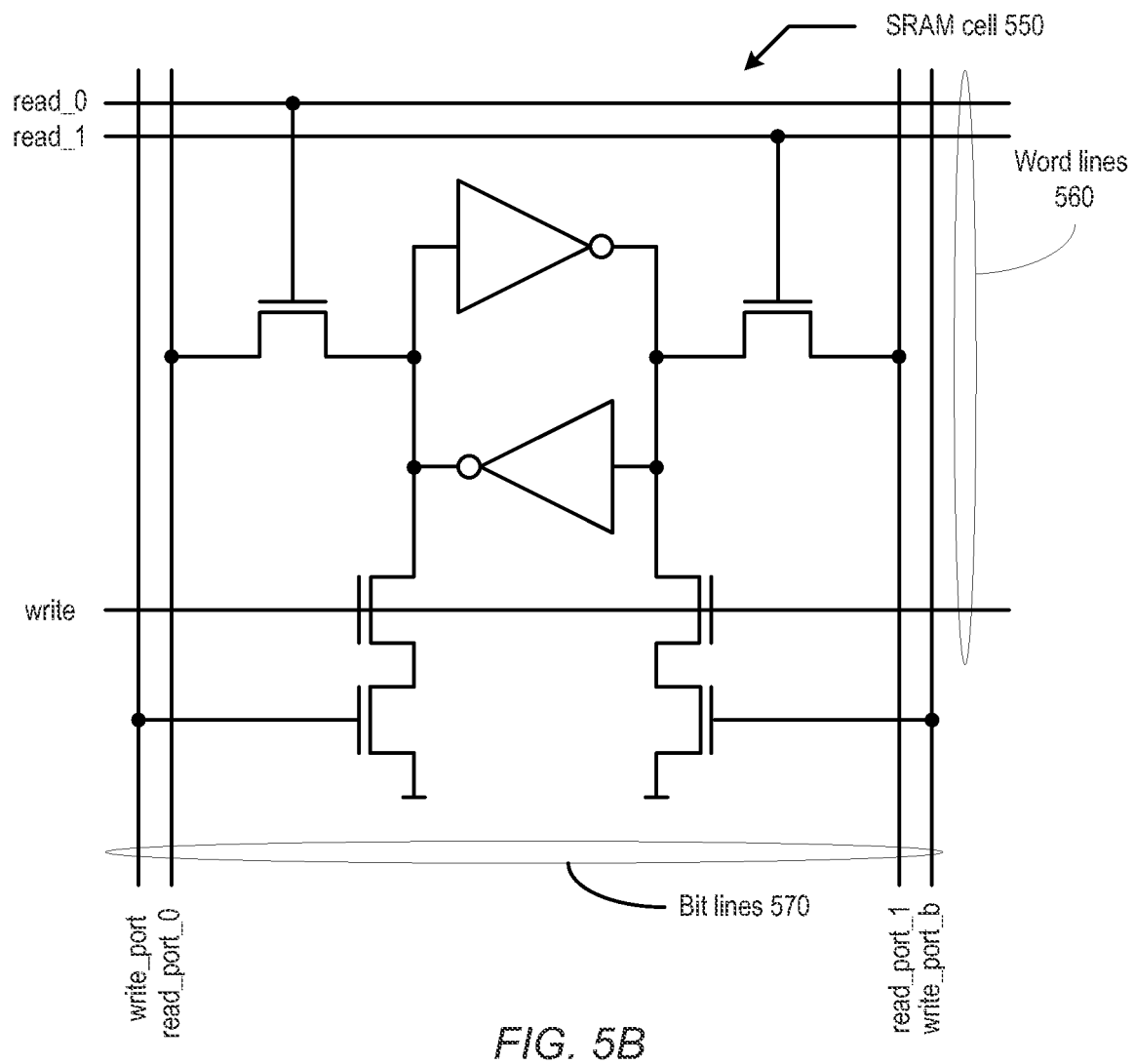

FIGS. 5A-B illustrate how storage cell complexity increases as ports are added. FIG. 5A illustrates one embodiment of a basic SRAM storage cell that is configured with a single port (used either for reading or writing). SRAM cell 500 includes a pair of cross-coupled inverters configured as a storage element, which will preserve whatever value was previously written to the cell. When word line 510 is asserted during a read mode of operation, the value stored by the inverters is coupled (in a complementary representation) via pass transistors onto bit lines 520 for reading. When word line 510 is asserted during a write mode of operation, the write data value presented on bit lines 520 is stored within the storage element.

In contrast, FIG. 5B illustrates an SRAM cell 550 having three independent ports: 2 read ports and 1 write port. SRAM cell 550 maintains the same basic dual-inverter storage element as used in the single-port example, but includes increased wiring and device complexity. In the illustrated embodiment, three distinct word lines 560 control three different paths for data into or out of the storage element via three distinct sets of bit lines 570. When either the of the read_0 or read_1 word lines is asserted, data is coupled from the storage element onto the respective read_port_0 or read_port_1 bit line via respective pass transistors. (In the illustrated embodiment, the read ports are treated as single-ended data having opposite senses. An additional inversion, not shown, may be applied to one of the read port bit lines to restore the correct sense of the read data relative to the other bit line.) When the write word line is asserted, dual-rail write data is driven onto the pair of write bit lines write_port and write_port_b, and is stored into the storage element by causing one of the nodes of the storage element to be pulled to ground through a pair of transistors.

Numerous alternative variations for constructing multi-ported storage cells are possible and contemplated. However, it is evident from a comparison of FIGS. 5A-B that adding multiple access ports may increase the number of devices and wires needed to implement a storage cell, which may in turn increase the size, complexity, and power consumption of the register file itself. Consequently, reducing the number of storage cell ports needed to implement a multiported register file may have a significant effect on the size and cost of the register file.

Organizing Multiported Register Files for Multithreaded Machines

Returning to the example of FIG. 4, suppose that FP register file 410 were implemented in a multithreaded machine supporting N threads (e.g., 8 threads). Although this example nominally requires 4 register file output ports and 2 register file input ports, it is noted that three of the output ports are dedicated to providing operands for the same instruction. Generally speaking, in most embodiments of multithreaded processor architectures, threads are separate from one another from the perspective of executing software. That is, for any given instruction that is associated with a particular thread, the given instruction may be constrained to access only that machine state that is also associated with the same particular thread. Thus, an instruction associated with thread 0 may not be able to access, or even ascertain the existence of, machine state corresponding to a thread other than thread 0. From a software perspective, threads may thus behave like distinct virtual machines.

Thus, in some embodiments, the three output ports of FP register file 410 that are dedicated to a single instruction may, by extension, correspond to the same thread. For example, in such embodiments, it may never be the case that one of these ports corresponds to a thread J while the other two correspond to a different thread K. This property may enable FP register file 410 to be constructed using individual storage cells that each have fewer total ports than FP register file 410 itself.

Figure 6:
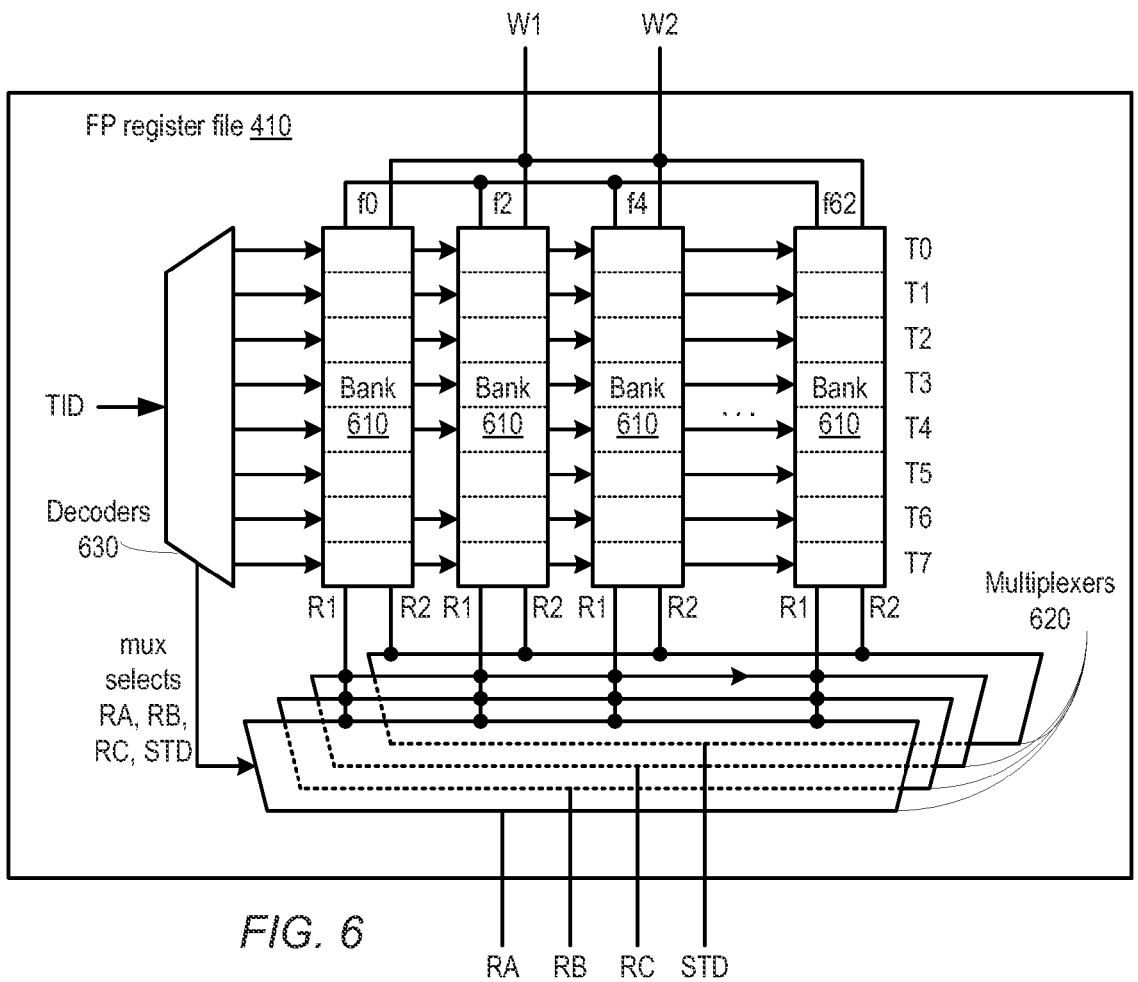
FIG. 6 is a block diagram illustrating an embodiment of a multithreaded register file.

One such embodiment of FP register file 410 is shown in FIG. 6. In the illustrated embodiment, FP register file 410 includes a number of banks 610 and multiplexers 620, as well as decoders 630 configured to generate control signals. Each of the banks 610 corresponds to a respective one of the defined register identifiers that make up the user-addressable set of registers. For example, in the illustrated embodiment, there are 32 64-bit floating-point register identifiers that identify the registers visible to software at a given time, denoted f0, f2, f4 . . . f62. (In some embodiments, some of these registers may also be addressable as individual single-precision 32-bit floating-point registers. For example, identifiers f0, f1, f2, f3, and so on may denote separately addressable 32-bit quantities.) Each of these register identifiers, when combined with a particular thread identifier, may correspond to a particular storage location within FP register file 410 that may be read or written by an instruction. Thus, in this example, FP register file 410 includes 32 instances of banks 610.

Each bank 610 may have two read ports R1, R2 and two write ports W1, W2, and may include one entry for each thread. Thus, in the illustrated embodiment, each of banks 610 may include 8 entries denoted T0 through T7. The entries need not be implemented in any particular order within banks 610, though using a consistent order for each of banks 610 may facilitate physical design of the storage array. In various embodiments, each bank 610 may be implemented as an distinct array of individual storage cells in which the storage cell word lines are decoded from the thread identifier (TID) corresponding to a particular read or write port. Alternatively, banks 610 may be collectively implemented as a single array, or partitioned into several physical arrays each of which includes a number of banks 610.

FP register file 410 additionally includes one multiplexer 620 for each of the register file output ports RA, RB, RC, and STD. Each multiplexer 620 has one input port corresponding to a respective one of banks 610. Thus, in the illustrated embodiment, FP register file 410 includes 4 32:1 multiplexers 620. For each of banks 610, read port R1 may be coupled to the corresponding input port of each of the three multiplexers 620 corresponding to register file output ports RA, RB, and RC, while read port R2 may be coupled to the corresponding input port of the multiplexer 620 corresponding to register file output port STD.

Thus, in the illustrated embodiment, one of the read ports of bank 610 (which may correspond to a read port of the underlying storage cell) is coupled to multiplexers that drive three of the output ports of FP register file 410, and the other read port is coupled to a multiplexer that drives the fourth output port of FP register file 410. In the illustrated embodiment, the two input ports of FP register file 410 may be coupled to the two write ports of each bank 410, possibly after being qualified by the particular register identifier (and thus bank 410) that is to be written. It is noted that in other embodiments, multiple levels of multiplexers or other suitable circuits may be used to multiplex the outputs of banks 610 to the various output ports of FP register file 410.

Figure 7:
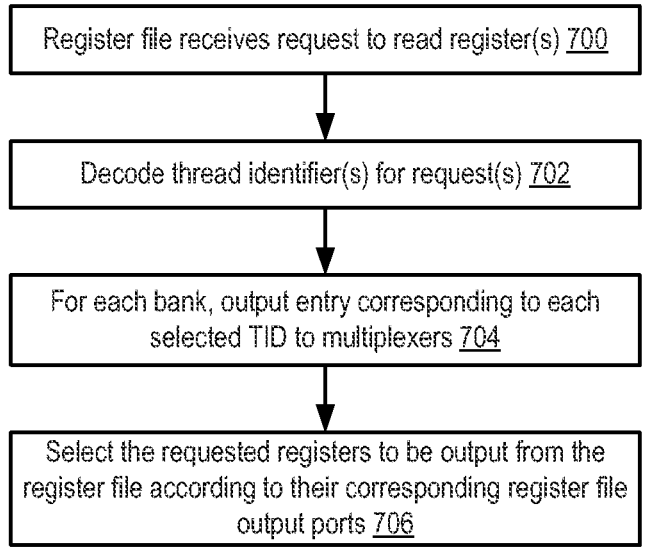
FIG. 7 is a flow diagram illustrating an embodiment of a method of operation of a multithreaded register file.

FIG. 7 illustrates one possible method of a read operation of a register file organized in a manner similar to FP register file 410 of FIG. 6. In the illustrated embodiment, operation begins in block 700 where the register file receives a request to read one or more registers. For example, referring to the embodiment of core 100 shown in FIG. 2, a floating point instruction may be issued to FGU 255 for execution. In connection with this instruction (e.g., in response to the instruction being issued by issue unit 230, or in response to particular control signals generated by FGU 255 or some other unit), FP register file 410 may receive a request to provide one or more values to be used as operands for the instruction. In various embodiments, the request may be received via one or more buses or other suitable control interfaces, and may include a thread identifier (TID) as well as register identifier information identifying which register value is to be supplied by which register file port.

In some embodiments, requests for multiple distinct instructions may be received concurrently. For example, as discussed above, an embodiment of FP register file 410 may be configured to supply up to three register operands for one instruction as well as a store data operand for a separate store instruction. In various embodiments, these requests may be encoded and received by the register file as distinct entities (e.g., as distinct control messages received through independent interfaces), or may be combined into a single entity.

Thus, for example, FP register file 410 may receive requests corresponding to two instructions, a non-store FPU instruction denoted I1 and an FP store instruction denoted I2. For purposes of this example, I1 and I2 may correspond to threads T3 and T7, though in other cases they may correspond to any two threads or to the same thread. The non-store instruction I1 may specify that registers having the identifiers %f16, %f20, and %f28 (for an example embodiment implementing the SPARC ISA) are to be supplied via the register file ports RA, RB, and RC, respectively. The store instruction I2 may specify that register %f4 is to be output by register file port STD. In other embodiments, the register file may receive requests corresponding to a different number of instructions that specify registers to be output to a different number of register file ports (e.g., two instructions each having three register file ports, three instructions each having two register file ports, etc.).

The thread identifier(s) for the received request(s) are then decoded (block 702). For example, in an embodiment of core 100 that implements 8 threads, FP register file 410 may receive the TID as two encoded 3-bit fields, one for each of the two instructions for which FP register file 410 may concurrently process requests. Decoders 630 may then decode the TID into a format suitable for use by banks 610. For example, the TID may be decoded into a one-hot format for use as a word line to select a particular row within banks 610.

For each bank, an entry corresponding to each decoded TID is then output to the multiplexers (block 704). For example, in an embodiment of FP register file 410 having 32 instances of banks 610, the decoded TID may effectively select one bank entry (corresponding to a register) from each of the 32 banks 610. Logically, the decoded TID values may be understood as selecting a particular row from the array of banks 610, although the underlying physical implementation may vary in different embodiments. For example, circuit constraints may prevent a single word line from activating all of banks 610, so in some embodiments, banks 610 may be physically partitioned into subarrays having dedicated decoders 630 and/or other circuitry.

Referring to the previous example of instructions I1 and I2, because these instructions correspond to threads T3 and T7, the row of banks 610 that corresponds to T3 may be output (via read port R1 of banks 610) to the three multiplexers 620 corresponding to register file output ports RA, RB, and RC. That is, all 32 entries of the selected row may be presented to respective inputs of each of these three multiplexers 620. The row of banks 610 that corresponds to T7 may be output (via read port R2 of banks 610) to the multiplexer 620 corresponding to register file output port STD.

Based on their identifiers, the requested registers are then selected to be output from the register file according to their corresponding register file output ports (block 706). In some embodiments, decoders 630 may be configured to generate the selection signals that cause each of multiplexers 620 to select a corresponding one of the multiple input values read out from banks 610. For example, as noted above, instruction I1 has requested registers %f16, %f20, and %f28. In this example, decoders 630 may be configured to select these particular registers and cause them to be output from ports RA, RB, and RC of FP register file 410. Likewise, register %f4 may be selected and output from port STD.

In order to write a particular register, in some embodiments, decoders 630 may be configured to decode the TID of the register identifier to be written in a similar fashion as for a read operation, and to drive an appropriate signal (e.g., a write word line signal specific to a particular write port) to the selected row of banks 610. In various embodiments, the signal decoded from the TID may be further qualified with a signal identifying the particular bank 610 to be written, such as through the use of a column-enable signal decoded from the identifier of the destination register. Alternatively, the input data paths to banks 610 may be qualified such that only the input to the particular bank 610 to be written contains valid data, while the data inputs to the remaining banks 610 remain in a state that causes those banks 610 to be unaffected by the write operation.

It is noted that by grouping together those register file output ports that correspond to the same thread, and by organizing the register file so that threads are decoded and selected from the storage array prior to individual registers, the storage cells used in the storage array may require fewer ports than the register file itself. For example, while FP register file 410 nominally has 4 output ports, in the illustrated embodiment, three of these ports correspond to a common thread. Thus, by organizing FP register file 410 so that rows are selected on the basis of TID before individual registers are selected via multiplexers 620, banks 610 may be implemented with only 2 read ports rather than 4. Thus, if 2 write ports are also implemented, banks 610 may implement a total of 4 ports, which is a 33% reduction relative to the 6 total register file ports implemented by FP register file 410. This in turn may enable banks 610 to be reduced in size.

Combining Multiporting Techniques with Register Windows

Returning to FIG. 4, in some embodiments, integer register file 420 may be implemented as a flat register file similar to FP register file 410, in which case integer register file 420 may be organized and may operate in a manner similar to that shown in FIGS. 6-7. However, rather than a flat integer register file in which all architectural register identifiers for a given thread are concurrently visible to software, embodiments of the SPARC ISA may implement integer registers using a set of "register windows." In one such embodiment, at any given time, software may have access to 32 integer registers: 8 global registers defined within a set of global register levels GL, and 24 registers defined within the current register window. Of the latter, 8 registers may be denoted input registers, 8 may be denoted local registers, and 8 may be denoted output registers. Moreover, if the current register window is denoted with a number CWP, the output registers of window CWP are identical to the input registers of window CWP−1, and the input registers of window CWP are identical to the output registers of window CWP+1 (each of these being determined modulo the number of register windows implemented).

Figure 8:
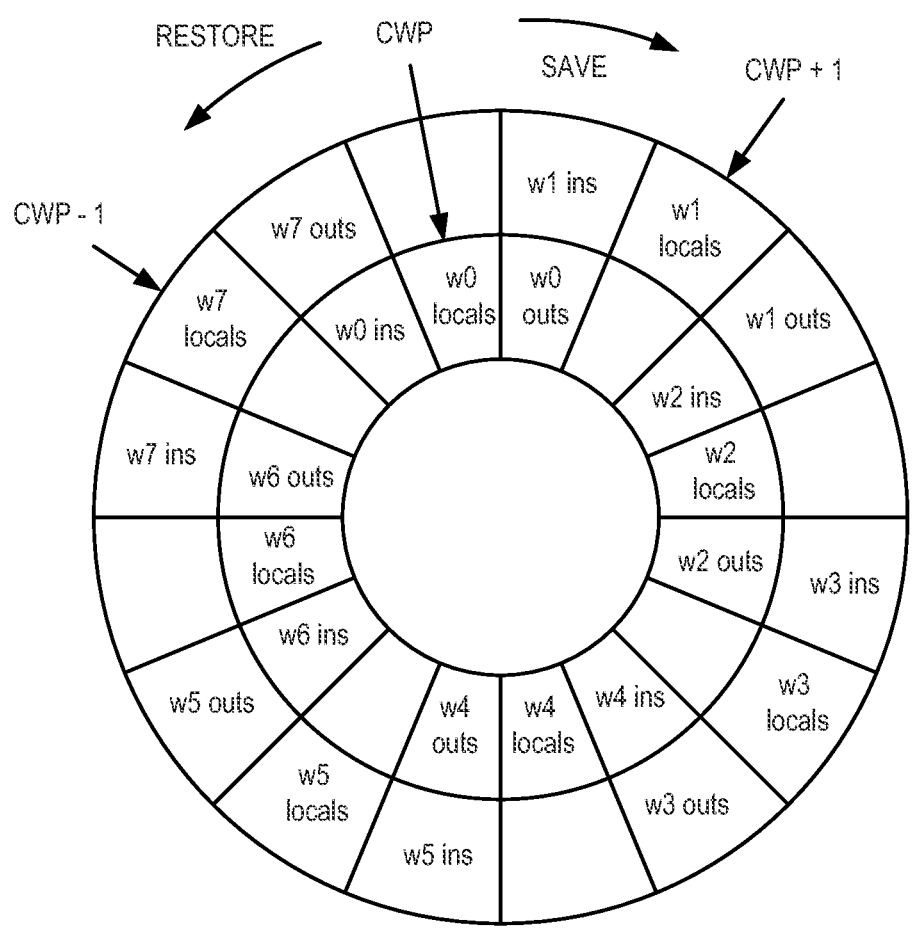
FIG. 8 is a block diagram illustrating an embodiment of a set of register windows.

FIG. 8 illustrates the relationship among register windows for an embodiment that includes 8 register windows, denoted w0 through w7. As shown in FIG. 8, execution of a SAVE or RESTORE instruction may cause CWP to be incremented or decremented, respectively. (In alternative embodiments, such as some processor embodiments prior to SPARC V9, CWP may instead be decremented on a SAVE and incremented on a RESTORE.) In some multithreaded embodiments of core 100 such as described above, one complete set of register windows (e.g., including the 8 windows shown in FIG. 8) may be provided for each thread, such that each thread has its own register state that is read and modified independent of the execution of other threads.

The 8 global registers that may be visible at any given time are not illustrated in FIG. 8. However, in some embodiments, multiple sets of these global registers may be implemented. Like the register windows, for which the value CWP denotes the currently visible window, the set or "level" of global registers that is visible to an instruction may be designated by a value GL.

In some embodiments, like the value of TID, the values of CWP and GL may be constant for a given instruction. That is, even if an instruction requires multiple operands to be read from multiple register file ports, each of these operands may correspond to the same thread, register window, and set of global registers. Thus, despite the added complexity of having to decode a larger number of parameters in order to select a particular register within integer register file 420 as opposed to FP register file 410, similar organizational techniques may be employed to reduce the number of read ports needed within the storage array of integer register file 420.

Revisiting the example of FIG. 4, in some embodiments, integer register file 420 may include 7 ports that may concurrently provide operands for up to three instructions. Of these, 4 register file output ports denoted RA1, RB1, RA2, and RB2 correspond to 2 non-store integer instructions, and 1 register file output port denoted STD corresponds to an integer store instruction. Additionally, 2 register file input ports denoted W1 and W2 correspond to integer results. In some embodiments, ports RA1 and RB1 may always share the same TID, CWP, and GL values, and ports RA2 and RB2 may share the same TID, CWP, and GL values (which may be the same as or different from the values for RA1 and RB1).

Suppose that integer register file 420 is implemented in a version of core 100 that supports 8 threads, 8 register windows, and 4 sets of global registers. The total number of integer registers included in such an embodiment may be determined as follows. (As shown in FIG. 8, each input register of one window overlaps with an output register of another window.)

8 global registers per set, per thread*4 sets*8 threads=256 globals
8 local registers per window, per thread*8 windows*8 threads=512 locals
8 in/out registers per window, per thread*8 windows*8 threads=512 in/out Thus, in this embodiment, integer register file 420 may include 1280 total registers.

Figure 9:
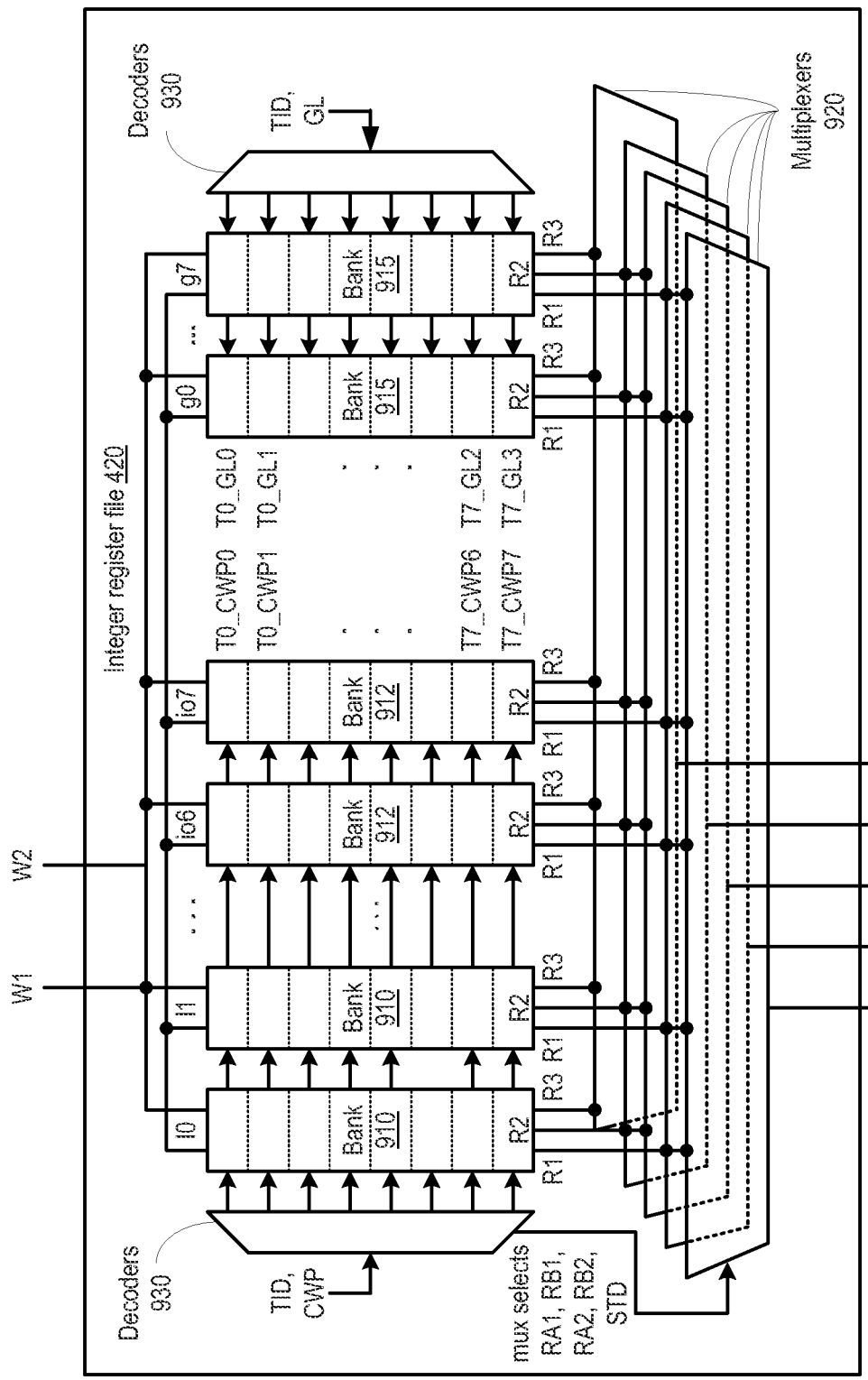
FIG. 9 is a block diagram illustrating an embodiment of a multithreaded register file having multiple register windows.

In some embodiments, TID applies to all integer registers, while CWP applies only to non-global registers (i.e., local registers or input/output registers) and GL applies only to global registers. Based on this feature, FIG. 9 illustrates one example embodiment of integer register file 420 that employs individual storage cells having fewer total ports than integer register file 420 itself. In the illustrated embodiment, integer register file 420 includes a number of local register banks 910, input/output register banks 912, global register banks 915, multiplexers 920, and decoders 930. It is noted that the arrangement shown in FIG. 9 is intended to facilitate illustration of the general logical structure of integer register file 420, and that numerous variations on the details of its logical and physical implementation are possible and contemplated.

In the illustrated embodiment, banks 910 may be collectively configured to store the 1024 local and input/output registers mentioned above, while global register banks 915 may be collectively configured to store the 256 global registers. As noted previously, TID, CWP, and GL may be consistent for all the ports corresponding to any given instruction. Thus, for each of the local register identifiers %l0-%l7, there exist 64 different register instances, one for each possible value of the combination of TID and CWP. Similarly, for each of the global register identifiers %g0-%g7, there exist 32 different register instances, one for each possible value of the combination of TID and GL. As shown in FIG. 8, for each one of the eight pairs of register windows w0/w1, w1/w2, w2/w3 . . . w7/w0, there exist 8 different register instances (having input register identifiers with respect to one register window of the pair, and output register identifiers with respect to the other). Thus, when a particular register identifier is combined with a particular value of TID, CWP, and/or GL, the combination may correspond to a particular storage location within integer register file 420 that may be read or written by an instruction.

Correspondingly, in the embodiment of FIG. 9, integer register file 420 may include 8 instances of banks 910. Each of banks 910 may correspond to a respective one of the 8 local register identifiers that may be selected for a given thread and window. Each of banks 910 may have three read ports R1, R2, R3 and two write ports W1, W2, and may include one entry for each of the 64 instances of its corresponding register identifier. In some embodiments, each bank 910 may be implemented as a distinct array of individual storage cells in which the storage cell word lines are decoded from the 64 possible combinations of TID and CWP that correspond to a particular read or write port.

In a similar fashion, integer register file 420 may include 8 instances of global register banks 915. Each of banks 915 may correspond to a respective one of the 8 global register identifiers that may be selected for a given value of TID and GL. Each of banks 915 may have three read ports R1, R2, R3 and two write ports W1, W2, and may include one entry for each of the 32 instances of its corresponding register identifier. In some embodiments, as with banks 910, each bank 915 may be implemented as a distinct array of individual storage cells in which the storage cell word lines are decoded from the 32 possible combinations of TID and GL that correspond to a particular read or write port.

In some embodiments, integer register file 420 may also include 16 instances of input/output register banks 912, which may be organized somewhat differently from local banks 910 owing to the overlap between register windows. As shown in FIG. 8, for each of the register window pairs w0/w7, w2/w1, w4/w3, and w6/w5, the input register identifiers %i0-

%i7 of the first (even) window correspond to the same storage location as the output register identifiers %o0-%o7 of the second (odd) window. Similarly, for each of the register window pairs w1/w0, w3/w2, w5/w4, and w7/w6, the input register identifiers %i0-%i7 of the first (odd) window correspond to the same storage location as the output register identifiers %o0-%o7 of the second (even) window.

Thus, in some embodiments, 8 of the input/output register banks 912 may store input/output register identifiers corresponding to the even window pairings, while the other 8 banks 912 may correspond to the odd window pairings. Each of banks 912 may be configured to store 32 entries: one entry for each of the 4 even or odd window pairs, with 8 possible threads per window pair. Correspondingly, although banks 912 are shown in FIG. 9 as being driven by the same decoders 930 as banks 910, the logic used to decode word lines for banks 912 may differ from that used for banks 910.

Integer register file 420 additionally includes one multiplexer 920 for each of the register file output ports RA1, RB1, RA2, RB2, and STD. Each multiplexer 920 has one input port corresponding to a respective one of banks 910, input/output register banks 912, and global register banks 915. Thus, in the embodiment shown in FIG. 9, integer register file 420 includes 5 multiplexers 910, although it is noted that in alternative embodiments, banks 910, 912, and 915 may be selected through separate multiplexers, possibly using several levels of multiplexing. For each of banks 910, 912, and 915, read port R1 may be coupled to the corresponding input port of each of the two multiplexers 920 corresponding to register file output ports RA1 and RB1. Similarly, read port R2 of each bank may be coupled to the corresponding input port of each of the two multiplexers 920 corresponding to register file output ports RA2 and RB2. Read port R3 of each bank may likewise be coupled to the corresponding input port of the multiplexer 920 corresponding to register file output port STD.

Thus, in the illustrated embodiment, read port R1 of banks 910, 912, and 915 (which may correspond to a read port of the underlying storage cell) is coupled to multiplexers that drive two of the output ports of integer register file 420 corresponding to one instruction, RA1 and RB1. Another one of the read ports of banks 910, 912, and 915, read port R2, is coupled to multiplexers that drive another two of the register file output ports corresponding to a second instruction, RA2 and RB2. The third read port R3 of banks 910, 912, and 915 is coupled to a multiplexer that drives the fifth register file output port corresponding to a store instruction, STD. In the illustrated embodiment, the two input ports of integer register file 420 may be coupled to the two write ports of each of banks 910, 912, and 915, possibly after being qualified by the particular register (and thus bank) that is to be written. It is noted that in other embodiments, multiple levels of multiplexers or other suitable circuits may be used to multiplex the outputs of banks 910 and 915 to the various output ports of integer register file 420.

Figure 10:
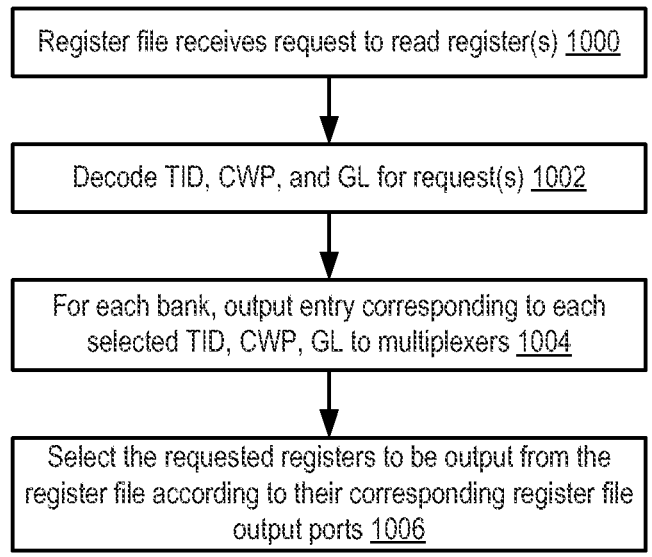
FIG. 10 is a flow diagram illustrating an embodiment of a method of operation of a multithreaded, multiwindowed register file.

FIG. 10 illustrates one possible method of a read operation of a multithreaded register file employing register windows and which is organized in a manner similar to integer register file 420 of FIG. 9. In the illustrated embodiment, operation begins in block 1000 where the register file receives a request to read one or more registers. For example, referring to the embodiment of core 100 shown in FIG. 2, an integer instruction may be issued to execution units 235-240 or to load store unit 245 for execution. In connection with this instruction (e.g., in response to the instruction being issued by issue unit 230, or in response to particular control signals generated by the execution units or some other unit), integer register file 420 may receive a request to provide one or more values to be used as operands for the instruction. In various embodiments, the request may be received via one or more buses or other suitable control interfaces, and may include a thread identifier TID, an identifier of the current register window CWP, an identifier of the current set of global registers in use GL, and register identifier information identifying which register value is to be supplied by which register file port.

In some embodiments, requests for multiple distinct instructions may be received concurrently. For example, as discussed above, an embodiment of integer register file 420 may be configured to supply up to two register operands for each of two distinct integer instructions as well as a store data operand for a separate integer store instruction. In various embodiments, these requests may be encoded and received by the register file as distinct entities (e.g., as distinct control messages received through independent interfaces), or may be combined into a single entity.

Thus, for example, integer register file 420 may receive requests corresponding to three different instructions: two non-store-data integer instructions denoted I1 and I2 and an integer store instruction denoted I3. For purposes of this example, I1 may correspond to thread T2, window CWP5, and globals GL1. I2 may correspond to thread T5, window CWP5, and globals GL0. I3 may correspond to thread T6, window CWP1, and globals GL1. (In other instances, the instructions may have any suitable corresponding TID, CWP, and GL, including values that identify the same thread, window, or globals.)

For this example, instruction I1 may specify that registers %l3 and %g1 (for an example embodiment implementing the SPARC ISA) are to be supplied via the register file output ports RA1 and RB1, respectively. Instruction I2 may specify that registers %i2 and %l2 be supplied via register file output ports RA2 and RB2, respectively. The store instruction I3 may specify that register %g4 is to be output by register file port STD. In other embodiments, the register file may receive requests corresponding to a different number of instructions that specify registers to be output to a different number of register file ports (e.g., two instructions each having three register file ports, three instructions each having two register file ports, etc.).

The thread, window, and global register identifier(s) TID, CWP, and GL for the received request(s) are then decoded (block 1002). For example, in an embodiment of core 100 that implements 8 threads, 8 windows, and 4 sets of global registers, integer register file 420 may receive three copies of each of TID, CWP, and GL (encoded as 3-bit, 3-bit, and 2-bit fields respectively), one for each of the three instructions for which integer register file 420 may concurrently process requests. Decoders 930 may then decode the TID, CWP, and GL into a format suitable for use by banks 910 and global register banks 915.

For example, in some embodiments, CWP and GL may be mutually exclusive, such that only one of these fields may apply to any given register. Correspondingly, in some embodiments, one set of decoders 930 may decode the possible combinations of TID and CWP (64, in this example) into a one-hot format for use as word lines to select a particular row within banks 910. The same or a different set of decoders 930 may also decode TID and CWP into the format used to select entries from among input/output register banks 912, according to the organization discussed above. Another set of decoders 930 may decode the possible combinations of TID and GL (32, in this example) into a one-hot format for use as a separate set of word lines to select a particular row within global register banks 915. However, it is noted that numerous other logical or physical arrangements of the register file storage array are possible. For example, TID, CWP, and GL may be decoded into a single set of word lines, rather than two independent sets.

For each bank, an entry corresponding to the decoded TID, CWP, and GL is then output to the multiplexers (block 1004). For example, in an embodiment of integer register file 420 having 8 instances of banks 910, the decoded combination of TID and CWP may effectively select one bank entry (corresponding to a particular instance of a local or input/output register) from each of the 8 banks 910. Similarly, in an embodiment having 8 instances of global register banks 915, the decoded combination of TID and GL may effectively select one entry (corresponding to a particular instance of a global register) from each of the 8 global register banks 915. Logically, the decoded TID and CWP values may be understood as selecting a particular row from the array of banks 910, and the decoded TID and GL may be understood as selecting a particular row from the array of global register banks 915, although the underlying physical implementation may vary in different embodiments. For example, circuit constraints may prevent a single word line from activating all of banks 910 or 915, so in some embodiments, banks 910 and/or 915 may be physically partitioned into subarrays having dedicated decoders 930 and/or other circuitry.

Referring to the previous example of instructions I1, I2, and I3, because instruction I1 corresponds to thread T2, window CWP5, and globals GL1, the rows of banks 910 and 912 that correspond to T2 and CWP5 and the row of global register banks 915 that correspond to T2 and GL1 may be output, via read port R1 of banks 910 and 915, to the two multiplexers 920 corresponding to integer register file output ports RA1 and RB1. That is, all entries of the selected row of local registers, input/output registers, global registers may be presented to respective inputs of the two multiplexers 920.

In a similar manner, for instruction I2, which corresponds to T5, CWP5, and GL0, the rows of banks 910 and 912 corresponding to T5 and CWP5 and the row of global register banks 915 corresponding to T5 and GL0 may be output, via read port R2 of banks 910 and 915, to the two multiplexers 920 corresponding to integer register file output ports RA2 and RB2. For instruction I3, which corresponds to T6, CWP1, and GL1, the rows of banks 910 and 912 corresponding to T6 and CWP1 and the row of global register banks 915 corresponding to T6 and GL1 may be output, via read port R3 of banks 910 and 915, to the multiplexer 920 corresponding to integer register file output port STD.

The requested registers are then selected to be output from the register file according to their corresponding register file output ports (block 1006). In some embodiments, decoders 930 may be configured to generate the selection signals that cause each of multiplexers 920 to select a corresponding one of the multiple input values read out from banks 910. For example, as noted above, instruction I1 has requested registers %l3 and %g1. In this example, decoders 930 may be configured to select these particular registers from the appropriate ones of banks 910 and 915 via multiplexers 920, and cause them to be output from ports RA1 and RB1 of integer register file 420. The registers for instructions I2 and I3 may be selected and output in a similar fashion.

In order to write a particular register, in some embodiments, decoders 930 may be configured to decode the TID, CWP, and GL of the register identifier to be written in a similar fashion as for a read operation, and to drive an appropriate signal (e.g., a write word line signal specific to a particular write port) to the selected row of local banks 910, input/output banks 912, and/or global register banks 915. In various embodiments, the signal decoded from the TID, CWP, and GL may be further qualified with a signal identifying the particular local bank 910, input/output bank 912, or global register bank 915 to be written, such as through the use of a column-enable signal decoded from the identifier of the destination register. Alternatively, the input data paths to banks 910, 912, and 915 may be qualified such that only the input to the particular bank 910, 912, or 915 to be written contains valid data, while the data inputs to the remaining banks 910, 912, and 915 remain in a state that causes those banks to be unaffected by the write operation.

Notwithstanding the additional complexity introduced by register windowing, using the techniques described above, a similar result in the reduction of storage cell ports may be obtained with respect to integer register file 420 as for FP register file 410. Specifically, by grouping together those register file output ports that correspond to the same TID, CWP, and GL, and by organizing the register file so that TID, CWP, and GL are decoded and selected from the storage array prior to individual registers, the storage cells used in the storage array may require fewer ports than the register file itself. For example, while integer register file 420 nominally has 5 output ports, in the illustrated embodiment, two pairs of these ports may be grouped together to share a single storage cell read port. Thus, by organizing integer register file 420 so that rows are selected on the basis of TID, CWP, and GL before individual registers are selected via multiplexers 920, local banks 910, input/output banks 912, and global register banks 915 may be implemented with only 3 read ports rather than 5. Thus, if 2 write ports are also implemented, banks 910, 912, and 915 may implement a total of 5 ports, which is a 29% reduction relative to the 7 total register file ports implemented by integer register file 420. This in turn may enable banks 910, 912, and 915 to be reduced in size.

It is also noted that similar economies may be realized from using the above techniques in a single-threaded architecture that supports register windows. For example, a single-threaded architecture may omit support for the multiple distinct threads discussed above, while still implementing multiple register windows and sets of global registers. Correspondingly, in some embodiments, integer register file 420 may be implemented in a configuration similar to that shown in FIG. 9, but where decoders 930 decode only the CWP and GL fields. In such an embodiment, local banks 910 may be configured to store 64 registers (8 windows*8 local registers per window), arranged as 8 banks having 8 entries each. Input/output banks 912 may be configured to store the 64 overlapping input/output registers, for example, as 8 banks storing 4 entries corresponding to the even bank pairings, and 8 banks storing 4 entries corresponding to the odd bank pairings. Similarly, global register banks 915 may be configured to store 32 registers (4 global levels*8 global registers per level), arranged as 8 banks having 4 entries each. The connectivity of banks 910 and 915 to multiplexers 920 may be substantially the same as that shown in FIG. 9, while decoders 930 may be simplified. For example, rather than decode the 64 possible combinations of TID and CWP and the 32 possible combinations of TID and GL, decoders 930 may be configured to decode only the 8 possible values of CWP for banks 910, and the 4 possible values of GL for global register banks 915.

It is noted that the specific properties of the register file examples discussed above are only illustrative, and that numerous variations are possible and contemplated. For example, different embodiments may implement more or fewer threads, ports, registers, or register windows than described above. Different register sizes, data formats, or nomenclature may also be employed. Also, in various physical implementations, decoders may be employed to reduce power consumption. For example, in some embodiments, instead of activating each bank within the register file array in order to read an entry, register identifier information may be decoded early enough in the register file read process so that only individual banks (or groups of banks) that are selected by the supplied register identifiers will be activated.

Example System Embodiment

Figure 11:
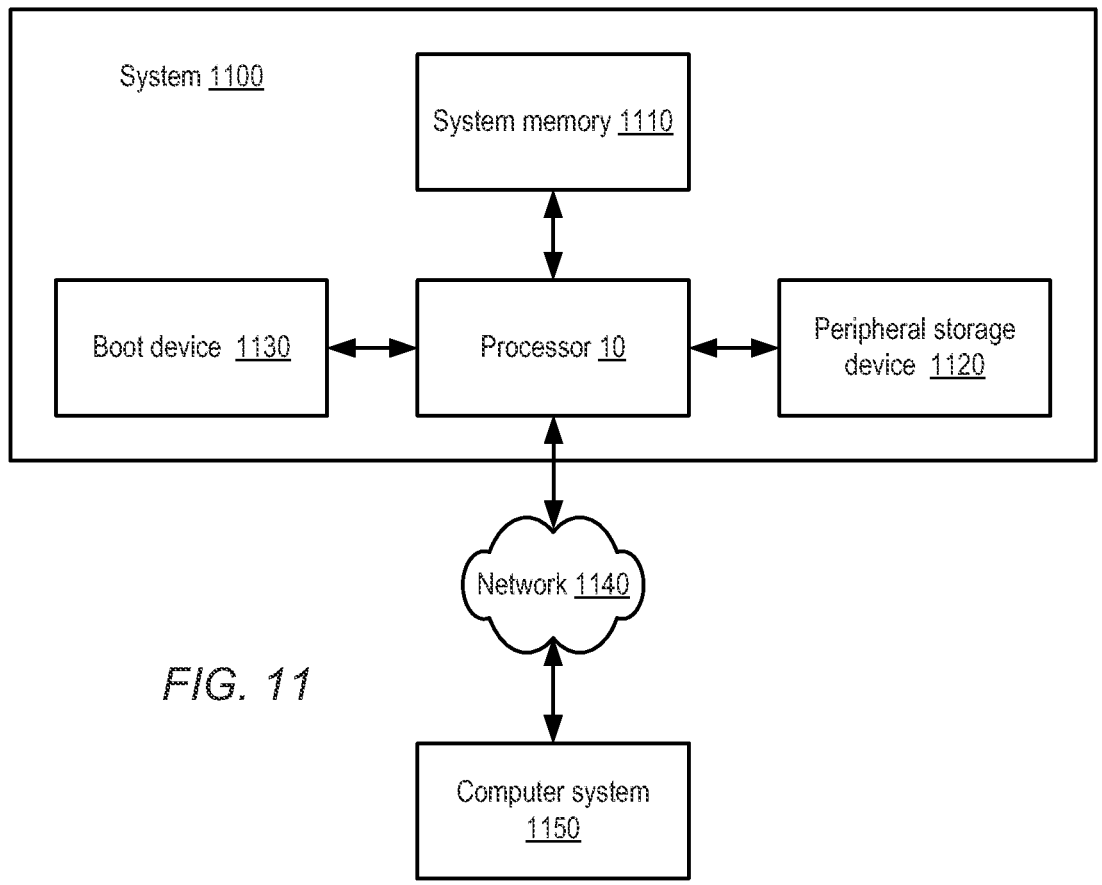
FIG. 11 is a block diagram illustrating an embodiment of a system including a multithreaded processor.

As described above, in some embodiments, processor 10 of FIG. 1 may be configured to interface with a number of external devices. One embodiment of a system including processor 10 is illustrated in FIG. 11. In the illustrated embodiment, system 1100 includes an instance of processor 10, shown as processor 10a, that is coupled to a system memory 1110, a peripheral storage device 1120 and a boot device 1130. System 1100 is coupled to a network 1140, which is in turn coupled to another computer system 1150. In some embodiments, system 1100 may include more than one instance of the devices shown. In various embodiments, system 1100 may be configured as a rack-mountable server system, as a standalone system, or in any other suitable form factor. In some embodiments, system 1100 may be configured as a client system rather than a server system.

In some embodiments, system 1100 may be configured as a multiprocessor system, in which processor 10a may optionally be coupled to one or more other instances of processor 10, shown in FIG. 10 as processor 10b. For example, processors 10a-b may be coupled to communicate via their respective coherent processor interfaces 140.

In various embodiments, system memory 1110 may comprise any suitable type of system memory as described above, such as FB-DIMM, DDR/DDR2/DDR3/DDR4 SDRAM, or RDRAM®, for example. System memory 1110 may include multiple discrete banks of memory controlled by discrete memory interfaces in embodiments of processor 10 that provide multiple memory interfaces 130. Also, in some embodiments, system memory 1110 may include multiple different types of memory.

Peripheral storage device 1120, in various embodiments, may include support for magnetic, optical, or solid-state storage media such as hard drives, optical disks, nonvolatile RAM devices, etc. In some embodiments, peripheral storage device 1120 may include more complex storage devices such as disk arrays or storage area networks (SANs), which may be coupled to processor 10 via a standard Small Computer System Interface (SCSI), a Fibre Channel interface, a Firewire® (IEEE 1394) interface, or another suitable interface. Additionally, it is contemplated that in other embodiments, any other suitable peripheral devices may be coupled to processor 10, such as multimedia devices, graphics/display devices, standard input/output devices, etc. In one embodiment, peripheral storage device 1120 may be coupled to processor 10 via peripheral interface(s) 150 of FIG. 1.

As described previously, in one embodiment boot device 1130 may include a device such as an FPGA or ASIC configured to coordinate initialization and boot of processor 10, such as from a power-on reset state. Additionally, in some embodiments boot device 1130 may include a secondary computer system configured to allow access to administrative functions such as debug or test modes of processor 10.

Network 1140 may include any suitable devices, media and/or protocol for interconnecting computer systems, such as wired or wireless Ethernet, for example. In various embodiments, network 1140 may include local area networks (LANs), wide area networks (WANs), telecommunication networks, or other suitable types of networks. In some embodiments, computer system 1150 may be similar to or identical in configuration to illustrated system 1100, whereas in other embodiments, computer system 1150 may be substantially differently configured. For example, computer system 1150 may be a server system, a processor-based client system, a stateless "thin" client system, a mobile device, etc. In some embodiments, processor 10 may be configured to communicate with network 1140 via network interface(s) 160 of FIG. 1.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A processor, comprising:
    an instruction fetch unit configured to issue instructions for execution, wherein the instructions are selected from a plurality of threads, wherein each given instruction has a corresponding thread identifier identifying the given instruction's associated thread, and wherein at least some of the instructions specify one or more operands via one or more of a plurality of register identifiers; and
    a register file configured to store operands usable by said instructions during execution, wherein said register file comprises a plurality of banks, wherein each of said banks corresponds to a respective one of the register identifiers, wherein each of said banks comprises a plurality of entries corresponding to said plurality of threads, wherein the entries are configured to store data values;
    wherein in response to receiving a request to read a particular register identifier, wherein the request corresponds to a given thread identifier, the register file is configured to:
        decode the given thread identifier to generate a selection signal coupled to each of the plurality of banks to retrieve entries from the plurality of banks that correspond to the given thread identifier, wherein the selection signal selects a particular entry from each of the plurality of banks; and
        from among the retrieved entries, select a data value corresponding to the particular register identifier to be output as a result of said request.

2. The processor as recited in claim 1, wherein the selection signal includes one or more word lines each coupled to select a particular row of one or more of the plurality of banks, wherein the register file includes a plurality of register file input and output ports, wherein each of said entries comprises a plurality of storage cells, wherein each of said storage cells comprises a plurality of read and write ports, and wherein a total number of said read and write ports is less than a total number of said register file input and output ports.

3. The processor as recited in claim 2, wherein at least some of the register file output ports are grouped such that multiple ones of the register file output ports are coupled to a single storage cell read port.

4. The processor as recited in claim 1, wherein the register file is configured to concurrently receive requests to read multiple register identifiers, wherein each request corresponds to a respective thread identifier, and in response to said requests, the register file is further configured to:

decode the thread identifiers to retrieve multiple sets of entries from the plurality of banks, wherein each of the sets of entries corresponds to a respective thread identifier; and from among the sets of entries, select data values corresponding to the multiple register identifiers to be output as results of said requests, wherein the selected data values are concurrently output via respective ones of the register file output ports.

5. The processor as recited in claim 1, wherein the request to read the particular register identifier further corresponds to a current window pointer identifying a given one of a plurality of register windows, and wherein to retrieve the retrieved entries from the plurality of banks, the register file is further configured to:

decode the current window pointer along with the given thread identifier, such that the retrieved entries are identified dependent upon both the given thread identifier and the current window pointer.

6. The processor as recited in claim 5, wherein at most one of said register windows is accessible to an instruction at a given time.

7. The processor as recited in claim 1, wherein the request to read the particular register identifier further corresponds to a global indicator identifying a given one of a plurality of sets of global registers, and wherein to retrieve the retrieved entries from the plurality of banks, the register file is further configured to:

decode the global indicator along with the given thread identifier, such that the retrieved entries are identified dependent upon both the given thread identifier and the global indicator.

8. A method, comprising:

a processor issuing instructions for execution, wherein the instructions are selected from a plurality of threads, wherein each given instruction has a corresponding thread identifier identifying the given instruction's associated thread, and wherein at least some of the instructions specify one or more operands via one or more of a plurality of register identifiers; and the processor storing operands usable by said instructions during execution within a register file, wherein said register file comprises a plurality of banks, wherein each of said banks corresponds to a respective one of the register identifiers, wherein each of said banks comprises a plurality of entries corresponding to said plurality of threads, wherein the entries are configured to store data values;

in response to the register file receiving a request to read a particular register identifier, wherein the request corresponds to a given thread identifier:

decoding the given thread identifier into a selection signal that is coupled to each of the plurality of banks to retrieve entries from the plurality of banks that correspond to the given thread identifier, wherein the selection signal selects a particular entry from each of the plurality of banks; and from among the retrieved entries, selecting a data value corresponding to the particular register identifier to be output as a result of said request.

9. The method as recited in claim 8, wherein the selection signal includes one or more word lines each coupled to select a particular row of one or more of the plurality of banks, wherein the register file includes a plurality of register file input and output ports, wherein each of said entries comprises a plurality of storage cells, wherein each of said storage cells comprises a plurality of read and write ports, and wherein a total number of said read and write ports is less than a total number of said register file input and output ports.

10. The method as recited in claim 9, wherein at least some of the register file output ports are grouped such that multiple ones of the register file output ports are coupled to a single storage cell read port.

11. The method as recited in claim 8, further comprising the register file concurrently receiving requests to read multiple register identifiers, wherein each request corresponds to a respective thread identifier, and in response to said requests:

decoding the thread identifiers to retrieve multiple sets of entries from the plurality of banks, wherein each of the sets of entries corresponds to a respective thread identifier; and from among the sets of entries, selecting data values corresponding to the multiple register identifiers to be output as results of said requests, wherein the selected data values are concurrently output via respective ones of the register file output ports.

12. The method as recited in claim 8, wherein the request to read the particular register identifier further corresponds to a current window pointer identifying a given one of a plurality of register windows, and wherein decoding the given thread identifier to retrieve the retrieved entries from the plurality of banks further comprises:

decoding the current window pointer along with the given thread identifier, such that the retrieved entries are identified dependent upon both the given thread identifier and the current window pointer.

13. The method as recited in claim 12, wherein at most one of said register windows is accessible to an instruction at a given time.

14. The method as recited in claim 8, wherein the request to read the particular register identifier further corresponds to a global indicator identifying a given one of a plurality of sets of global registers, and wherein decoding the given thread identifier to retrieve the retrieved entries from the plurality of banks further comprises:

decoding the global indicator along with the given thread identifier, such that the retrieved entries are identified dependent upon both the given thread identifier and the global indicator.

15. A system, comprising:

a system memory; and a processor coupled to the system memory and comprising a register file;

wherein the processor is configured to issue instructions for execution, wherein the instructions are selected from a plurality of threads, wherein each given instruction has a corresponding thread identifier identifying the given instruction's associated thread, and wherein at least some of the instructions specify one or more operands via one or more of a plurality of register identifiers;

wherein the register file is configured to store operands usable by said instructions during execution, wherein said register file comprises a plurality of banks, wherein each of said banks corresponds to a respective one of the register identifiers, wherein each of said banks comprises a plurality of entries corresponding to said plurality of threads, wherein the entries are configured to store data values; and wherein in response to receiving a request to read a particular register identifier, wherein the request corresponds to a given thread identifier, the register file is configured to:

decode the given thread identifier to generate a selection signal coupled to each of the plurality of banks to retrieve entries from the plurality of banks that correspond to the given thread identifier, wherein the selection signal selects a particular entry from each of the plurality of banks; and from among the retrieved entries, select a data value corresponding to the particular register identifier to be output as a result of said request.

16. The system as recited in claim 15, wherein the selection signal includes one or more word lines each coupled to select a particular row of one or more of the plurality of banks, wherein the register file includes a plurality of register file input and output ports, wherein each of said entries comprises a plurality of storage cells, wherein each of said storage cells comprises a plurality of read and write ports, and wherein a total number of said read and write ports is less than a total number of said register file input and output ports.

17. The system as recited in claim 16, wherein at least some of the register file output ports are grouped such that multiple ones of the register file output ports are coupled to a single storage cell read port.

18. The system as recited in claim 15, wherein the register file is configured to concurrently receive requests to read multiple register identifiers, wherein each request corresponds to a respective thread identifier, and in response to said requests, the register file is further configured to:

decode the thread identifiers to retrieve multiple sets of entries from the plurality of banks, wherein each of the sets of entries corresponds to a respective thread identifier; and from among the sets of entries, select data values corresponding to the multiple register identifiers to be output as results of said requests, wherein the selected data values are concurrently output via respective ones of the register file output ports.

19. A processor, comprising:

an instruction fetch unit configured to issue instructions for execution, wherein each given instruction has a corresponding current window pointer identifying one of a plurality of register windows associated with the given instruction, and wherein at least some of the instructions specify one or more operands via one or more of a plurality of register identifiers; and a register file configured to store operands usable by said instructions during execution, wherein said register file comprises a plurality of banks, wherein each of said banks corresponds to a respective one of the register identifiers, wherein each of said banks comprises a plurality of entries corresponding to said plurality of register windows, wherein the entries are configured to store data values, and wherein for a given one of the register windows, entries corresponding to input registers of the given register window overlap with entries corresponding to output registers of a different register window;

wherein in response to receiving a request to read a particular register identifier, wherein the request corresponds to a given current window pointer, the register file is configured to:

decode the given current window pointer to retrieve entries from the plurality of banks that correspond to the given current window pointer; and from among the retrieved entries, select a data value corresponding to the particular register identifier to be output as a result of said request.

20. The processor as recited in claim 19, wherein the register file includes a plurality of register file input and output ports, wherein each of said entries comprises a plurality of storage cells, wherein each of said storage cells comprises a plurality of read and write ports, and wherein a total number of said read and write ports is less than a total number of said register file input and output ports.

* * * * *